United States Patent
Barrall et al.

(10) Patent No.: US 6,392,408 B1
(45) Date of Patent: *May 21, 2002

(54) METHOD AND SYSTEM FOR CANCELLATION OF EXTRANEOUS SIGNALS IN NUCLEAR QUADRUPOLE RESONANCE SPECTROSCOPY

(75) Inventors: Geoffrey A. Barrall, San Diego; Lowell J. Burnett, El Cajon, both of CA (US); Alan G. Sheldon, Las Vegas, NV (US)

(73) Assignee: Quamtum Magnetics, Inc., San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/074,305

(22) Filed: May 6, 1998

(51) Int. Cl.[7] .............................................. G01V 3/00
(52) U.S. Cl. ...................................... 324/300; 324/307
(58) Field of Search ............................... 324/300, 301, 324/314, 307, 309, 322, 310

(56) References Cited

U.S. PATENT DOCUMENTS

| | | | |
|---|---|---|---|
| 4,166,972 A | 9/1979 | King et al. | 324/0.5 AC |
| 4,296,378 A | 10/1981 | King | 324/313 |
| 4,514,691 A * | 4/1985 | De Los Santos | 324/301 |
| 4,769,602 A | 9/1988 | Vinegar et al. | 324/303 |
| 4,887,034 A | 12/1989 | Smith | 324/307 |
| 5,206,592 A | 4/1993 | Buess et al. | 324/300 |
| 5,233,300 A | 8/1993 | Buess et al. | 324/300 |
| 5,365,171 A | 11/1994 | Buess et al. | 324/307 |
| 5,592,083 A | 1/1997 | Magnuson et al. | 324/300 |
| 5,986,455 A * | 11/1999 | Magnuson | 324/318 |

FOREIGN PATENT DOCUMENTS

| | | | |
|---|---|---|---|
| GB | 2257525 | 1/1993 | G01R/33/38 |
| GB | 2 282 666 | 12/1995 | G01R/33/46 |
| WO | WO97/03366 | 1/1997 | G01R/33/44 |

OTHER PUBLICATIONS

Klainer et al., *Fourier Transform Nuclear Quadrupole Resonance Spectroscopy*, Fourier, Hadamard & Hilbert Transforms In Chemistry, Plenum Press, pp. 147–182 (1982).

Rollwitz et al., *Fundamentals of Nuclear Magnetic Resonance . . . Explosives*, Proc. New Concepts Symp. & Workshop on Det. & Ident. of Explosives, NTIS, pp. 377–389 (1978).

Marino, *Detection and Identification of Explosives by $^{14}N$ NQR*, NTIS, pp. 399–403 (1978).

R. A. Marino et al., *Multiple Spin Echoes in Pure Quadrupole Resonance*, vol. 67, pp. 3388 et seq. (1977).

* cited by examiner

Primary Examiner—Louis Arana
(74) Attorney, Agent, or Firm—The Maxham Firm

(57) ABSTRACT

A method and system for canceling extraneous signals in a nuclear quadrupole resonance (NQR) system used for the detection of explosives and drugs. A specimen is irradiated with a specific sequence of electromagnetic pulses, referred to as a spin-locked inversion mid-echo (SLIME) pulse sequence with each pulse having a specified phase and duration. The pulses are separated by specified time intervals. The SLIME pulse sequence has a single excitation pulse. As a result of the characteristics of the SLIME pulse sequence, if the target substance to be detected is present in the specimen, sets of oppositely-phased NQR echo signals are generated from the target substance. NQR echo signals of one phase are subtracted from NQR echo signals having the opposite phase, rendering a cumulative echo signal, and simultaneously subtracting out the same-phase extraneous signal.

106 Claims, 15 Drawing Sheets

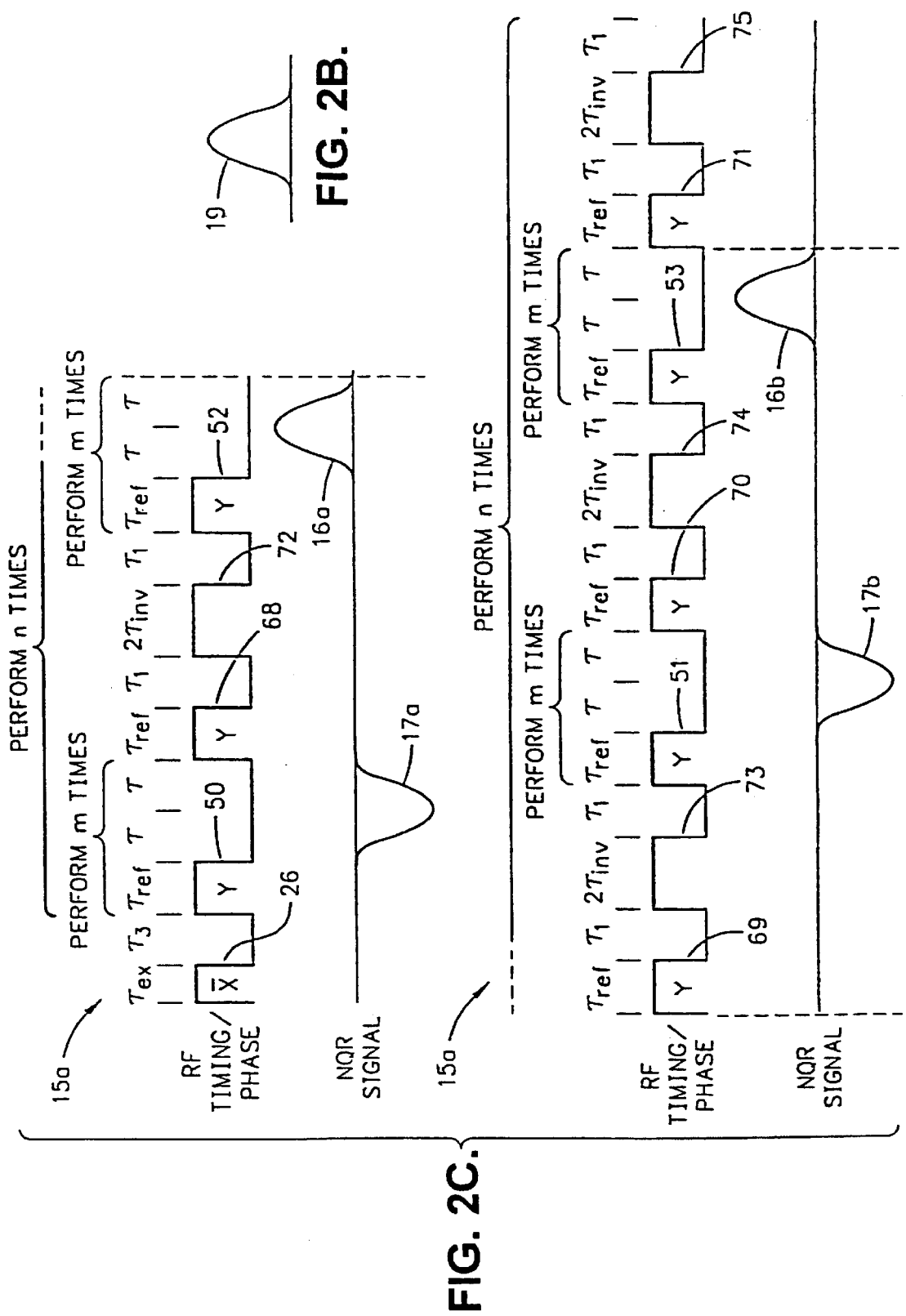

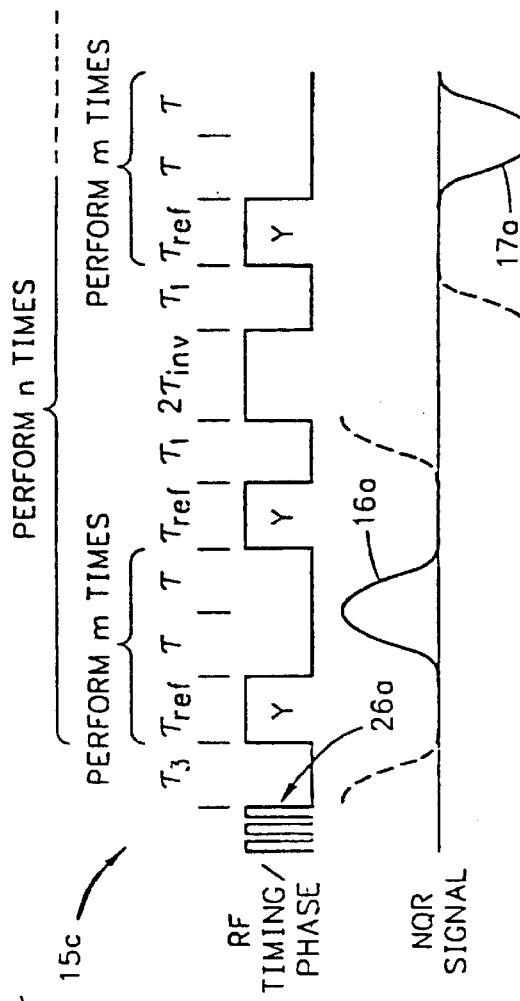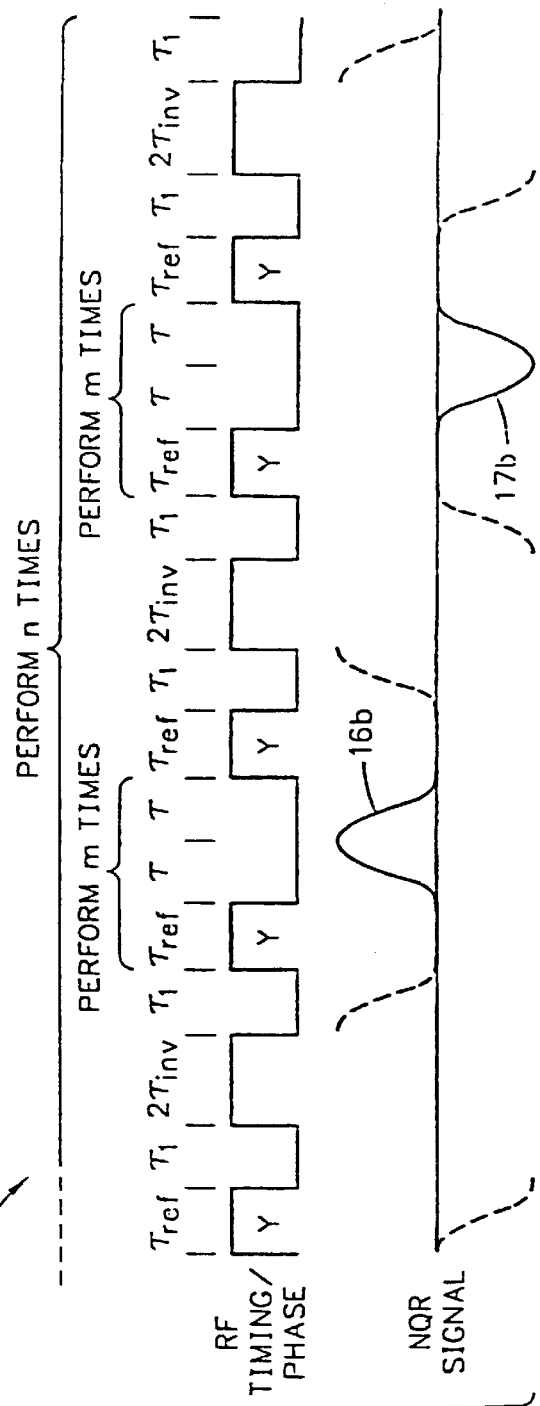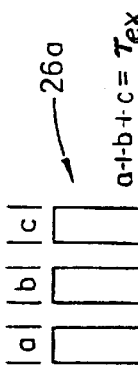
FIG. 6A.
FIG. 6B.

METHOD AND SYSTEM FOR CANCELLATION OF EXTRANEOUS SIGNALS IN NUCLEAR QUADRUPOLE RESONANCE SPECTROSCOPY

BACKGROUND OF THE INVENTION

1. Field of the Invention

This invention relates generally to a bulk substance detection system employing nuclear quadrupole resonance (NQR) for detecting concealed explosives and drugs, and more particularly to a pulse sequence for use in NQR for cancellation of, among others, magneto-acoustic ringing, piezoelectric ringing, electronic circuit ringing (pulse ringdown), and baseline offset.

2. Description of the Related Art

In the fight against terrorism, and for other purposes, there is a great need for a system that can quickly and reliably detect hidden explosives. Plastic explosives, for example those containing RDX and PETN, such as C-4 and Semtex, are highly stable, have clay-like malleability, and are deadly in relatively small quantities. Plastic explosives have an almost infinite variety of possible shapes and uses for terrorist bombing tactics. For example, a small piece of plastic explosive, a detonator, and a trip wire inside a large mailing envelope can cause a deadly explosion. Unfortunately, without close and potentially dangerous visual inspection, plastic explosives can be made virtually undetectable. For example, plastic explosives that have been formed into thin sheets have not been effectively detectable with prior technologies.

Similarly, in the fight against the illegal drug trade, there is a great need for a system that can quickly and accurately detect drugs inside sealed containers, mail it, parcels, and other small packages. Conventional drug detection methods are time-consuming, costly, and have had only marginal reliability.

NQR is a branch of radio frequency spectroscopy that has been used for the to detection of explosives and drugs. NQR exploits the inherent electrical properties of atomic nuclei. Nuclei with non-spherical electric charge distributions possess electric quadrupole moments. In solid materials, electrons and atomic nuclei produce electric field gradients. These electric field gradients interact with the nuclear quadrupole moments of quadrupolar nuclei, producing energy levels for the quadrupolar nuclei, and hence their characteristic transition frequencies. Measurements of these frequencies, or relaxation time constants, or both, can indicate not only which nuclei are present but also their chemical environment.

The phenomenon of NQR is possible because, when a quadrupolar atomic nucleus is within an electric field gradient, the quadrupoles experience a torque, which causes the nucleus to precess about the electric field gradient. This precessional motion causes the nuclear magnetic moment to also precess. An externally applied radio frequency (RF) magnetic field having a frequency at or near the quadrupole's precessional frequency results in resonance between the applied RF magnetic field and the nuclei's magnetic moment. This RF magnetic field, which is applied as a pulse, tips and momentarily synchronizes the orientations of the magnetic moments of these quadrupolar nuclei as they precess. As a result of this tipping of the orientations of the nuclei, which can also be described as the excitation of tile nuclei to higher energy levels, the energy level within each nucleus is briefly not in equilibrium. After application of the external RF magnetic field has ceased, the magnetic moments of the nuclei move out of synchronization with each other as the nuclei begin to return to equilibrium. As the nuclei move out of synchronization, they cumulatively generate an RF signal known as the free induction decay (FID) signal. The transmission of additional appropriate RF pulses can cause the generation of additional FID signals, and can also cause the generation of additional signals known as echoes, also referred to as spin-echoes. The spin-echoes are generated as the orientations of the magnetic moments of the nuclei pass through a synchronized orientation. A pick-up coil is used to detect both the FID and echo signals generated by the nuclei, which are subsequently received and amplified by a sensitive receiver.

Any chemical element's nucleus that has a spin quantum number greater than one-half has a non-spherical charge distribution, and can therefore exhibit quadrupolar resonance. Many nuclei have been identified that exhibit quadrupolar resonance, including: $^7$Li, $^9$Be, $^{14}$N, $^{17}$O, $^{23}$Na, $^{27}$Al, $^{35}$Cl, $^{37}$Cl, $^{39}$K, $^{55}$Mn, $^{75}$As, $^{79}$Br, $^{81}$Br, $^{127}$I, $^{197}$Au, and $^{209}$Bi. A significant factor in contraband detection by means of NQR is that quadrupolar nuclei that are commonly present, and potentially readily observable, in explosives and drugs include nitrogen ($^{14}$N), chlorine ($^{35}$Cl, $^{37}$Cl), sodium ($^{23}$Na), and potassium ($^{39}$K). The hydrochloride forms of drugs, such as cocaine hydrochloride, contain the quadrupolar nuclei $^{35}$Cl and $^{37}$Cl. $^{14}$N is the most studied quadrupole nucleus for explosives and narcotics detection, because $^{14}$N is a constituent element of both explosives and drugs, including 2,2-bis[(ni-troxy)methyl]-1,3-propanediol, dinitrate (commonly referred to as PETN), cocaine base, cocaine hydrochloride, and heroin based drugs.

The frequencies of the NQR signals generated by quadrupolar nuclei are an important distinguishing feature of the NQR signals. An NQR frequency of a nucleus is equal to the precessional frequency of the nucleus, which is determined both by the characteristics of the quadrupolar nucleus and by the local electronic environment of the nucleus. Importantly, due to differences between the local crystalline environments of different substances, the resonant frequencies of an element that may be present in many substances, $^{14}$N for example, are different in each substance. The resonant frequencies of an element may also be different in electronically inequivalent sites within a given substance. However, each resonant frequency is unique, well defined, and consistent.

In addition to the resonance frequencies, relaxation times of quadrupolar nuclei are other distinguishing features of an NQR response. Resonance frequencies and relaxation times are compound-, molecular site-, temperature-, and pressure-specific. The repetition rate and timing of RF pulses required for exciting and detecting a specific NQR signal are determined by relaxation times. Relaxation times can be as short as a few microseconds or as long as many seconds. The fundamental relaxation times are designated as follows: $T_1$, the spin-lattice relaxation time; $T_2^*$, the FED decay time constant; $T_2$, the spin-spin relaxation time; and $T_{2\mathit{eff}}$ ($T_2$ effective), the echo train decay time constant. The spin-lattice relaxation time $T_1$ is indicative of the time required for the nuclear spin system to return to equilibrium with its surroundings following a disturbance such as a resonant RF pulse. The FID decay time constant $T_2^*$ is the time constant of the decay of FID signals. The spin-spin relaxation time $T_2$ is the time constant of the decay of a two-pulse echo sequence. For spin-lock spin-echo (SLSE) pulse sequences (discussed below), the peak echo amplitudes decrease exponentially with a time constant $T_{2\mathit{eff}}$.

The presence and identity of explosives or drugs in a container are determined with an NQR system by irradiating the container with RF signals at or near a known NQR frequency of a target substance, and then detecting any quadrupolar resonance signals created by the application of the RF signal. The quadrupolar resonance signals, if any, are received by a receiver, and the output of the receiver is digitized and inputted to a computer. The computer compares the received signals with known parameters of a target substance, thereby determining whether the target substance is present. The process is then repeated by transmitting RF signals at NQR frequencies of additional target substances. Previous work in this area is reflected in U.S. Pat. No. 5,592,083 to Magnuson et al, ("Magnuson '083") for a "System and Method for Contraband Detection Using Nuclear Quadrupole Resonance including a Sheet Coil and RF Shielding Via Waveguide Below Cutoff."

It is widely known in the NQR art that the RF signals transmitted by NQR detection systems can induce undesirable magneto-acoustic ringing in magnetized materials, for example iron, ceramics, coating materials, spring steel, and even paper clips. It is generally believed that magneto-acoustic ringing is the result of ferromagnetic domains in magnetized materials attempting to realign in response to the applied RE magnetic field. This vibration of the ferromagnetic domains causes lattice distortions that reflect back and forth within the material, resulting in the transmission of RF waves near the frequency of, and in phase with, the applied RF magnetic field. This ringing may last on the order of a millisecond and may have an amplitude comparable to or much greater than the amplitudes of NQR signals transmitted from explosives or drugs. The RF signals transmitted by NQR systems can also excite undesirable piezo-electric ringing signals, which are interfering signals similar to magneto-acoustic ringing signals. Electronic circuit ringdown, and baseline offset are other undesirable signal artifacts that commonly exist in NQR systems.

The reliability of NQR systems for the detection of explosives and drugs can be significantly reduced due to magneto-acoustic ringing, piezo-electric ringing, electronic circuit ringdown, and baseline offset. The reliability is reduced because magneto-acoustic ringing signals and piezo-electric signals appear to be NQR signals from a target substance, which results in the system mistakenly indicating the presence of a target substance. Occurrences of this type of mistaken identification can be reduced by increasing the threshold level at which received signals are interpreted as NQR signals from a target substance. However, increasing the threshold level reduces the sensitivity of the system, which undesirably increases the size of the minimum detectable quantity of a target substance. Electronic circuit ringdown and baseline offset introduce signal errors that also can result in mistaken identification or non-identification of target substances.

U.S. Pat. No. 5,365,171 to Buess et al. ("Buess '171") for "Removing the Effects of Acoustic Ringing and Reducing Temperature Effects in the Detection of Explosives by NQR" discloses a system and method for removing the effects of magneto-acoustic ringing in some NQR applications. Buess '171 discloses a system in which a specimen is irradiated with a modified steady state free precession (SSFP) pulse sequence that is a combination of two SSFP pulse sequences, a phase-alternated pulse sequence (PAPS) and a non-phase-alternated pulse sequence (NPAPS). In SSFP pulse sequences, including the PAPS and NPAPS pulse sequences disclosed in Buess '171, each pulse functions as an excitation pulse. As specified in Buess '171, portions of the PAPS and NPAPS NQR response signals are added together or subtracted from each other, which results in removal of the FID contribution and also cancels out the DC magneto-acoustic ringing. However, as elaborated below, the system and method for removing magneto-acoustic ringing disclosed in Buess '171 are not useful for the detection of substances in which the ratio of $T_1/T_2$ for the quadrupolar nuclei of interest is greater than about five, and they are not useful in most applications for the detection of substances in which the quadrupolar nuclei of interest have a $T_1$ value that is greater than about one second.

When irradiated with SSFP pulse sequences, substances in which the quadrupolar nuclei of interest have a ratio of $T_1/T_2$ that is greater than about five produce very small amplitude NQR responses. These small amplitude NQR responses are not large enough to be useful for the detection of explosives or drugs. Consequently, SSFP pulse sequences, which include the PAPS and NPAPS pulse sequences used in the system and method disclosed in Buess '171, are not useful for the detection of quadrupolar nuclei in explosive or drug substances in which the ratio of $T_1/T_2$ is greater than about five. The nucleus of $^{14}N$ in PETN, a common ingredient in many plastic explosives, has a ratio of $T_1/T_2$ that is greater than five under conditions appropriate for detection.

In addition to SSFP pulse sequences, spin-locked spin-echo (SLSE) pulse sequences have been widely used in NQR systems. Early references to SLSE pulse sequences include R. A. Marino et al., "Multiple Spin Echoes in Pure Quadrupole Resonance," *Journal of Chemical Physics,* Vol. 67, pp. 3388 et seq., 1977, and R. A. Marino, "Detection and Identification of Explosives by $^{14}N$ in NQR," *Proceedings of the New Concepts Symposium and Workshop on Detection and Identification of Explosives,* pp. 399 et seq., Reston, Va., October 1978. A SLSE pulse sequence consists of an excitation pulse followed by a number of refocusing pulses, with each refocusing pulse having the same phase, which is ninety degrees from the phase of the excitation pulse. SLSE pulse sequences are effective for producing NQR echo signals. However, using multiple SLSE pulse sequences to reduce magneto-acoustic ringing or piezo-electric ringing has not proven effective for NQR detection.

In order to achieve artifact rejection when using a SLSE pulse sequence, the SLSE pulse sequence is typically performed two or more times, and a waiting time is required between repetitions of the SLSE pulse sequence. The waiting time required is a minimum of about 0.5 times $T_1$, and is ideally about three times $T_1$. Thus, in NQR detection systems using SLSE pulse sequences, two or more pulse sequences, and three or more $T_1$'s may be required. To maintain the same level of sensitivity when the value of $T_1$ increases, the time required for detection must also increase. Consequently, for most applications, it is not time effective to use SLSE a pulse sequences for the detection of substances in which $T_1$ is greater than about one second, and this is especially true for substances such as PETN in which $T_1$ is much greater than one second. Also, as stated above, SLSE pulse sequences have not proven practical for the elimination of magneto-acoustic ringing or piezo-electric ringing.

In addition to undesirable signal artifacts, temperature effects can also degrade the performance of NQR detection systems. Due to temperature effects, an actual NQR frequency of a quadrupolar nucleus may be offset from the expected value. This can result in the frequency of the transmitted RF pulses being too distant from the actual resonant frequency to produce resonance. In order for the excitation to produce resonance, the frequency of the transmitted RF waves must generally fall within a band of frequencies that is about two thousand Hz wide centered around the actual NQR frequency of the quadrupolar nuclei to be detected. If the transmitted frequency is outside of this band of frequencies, no NQR echo signals will be generated by the quadrupolar nuclei and the NQR detection system will erroneously indicate the absence of a target substance that is actually present in the specimen.

SUMMARY OF THE INVENTION

Broadly speaking, this invention provides a practical method and system for improving the performance of a nuclear quadrupole resonance (NQR) system used for detecting substances, such as explosives and drugs, that may be present in a specimen. More particularly, the invention provides for the cancellation of extraneous signals in an NQR detection system.

The present invention entails irradiating the specimen with a specific sequence of electromagnetic pulses, referred to as a spin-locked inversion mid-echo (SLIME) pulse sequence. The SLIME pulse sequence has only one excitation pulse. Each pulse in the SLIME pulse sequence has a specified phase and duration, and the pulses are separated by specified time intervals. The frequency of the pulses is chosen to be at or near an NQR resonant frequency of specific quadrupolar nuclei in a target substance. If the target substance is present, the SLIME pulse sequence manipulates the orientations of the magnetic moments of these quadrupolar nuclei, causing these quadrupolar nuclei to generate oppositely-phased sets of NQR echo signals. The NQR echo signals, along with extraneous signals that may be present, such as magneto-acoustic ringing signals and piezo-electric ringing signals, are received by the NQR detection system. Other extraneous signals that are generated within the NQR detection system may also be present, such as electronic circuit ringing and baseline offset. Unlike the oppositely-phased NQR echo signals, the extraneous signals detected by the NQR detection system such as magneto-acoustic ringing, piezo-electric ringing, electronic circuit ringing, and baseline offset are not oppositely-phased.

After the NQR echo signals are received, NQR echo signals of one phase are subtracted from NQR echo signals having the opposite phase, rendering a cumulative echo signal, and simultaneously subtracting out the same-phase extraneous signals. Because the SLIME pulse sequence is not a steady state free precession (SSFP) pulse sequence, the SLIME pulse sequence can be used to eliminate extraneous signals and to detect substances in which the nuclei of interest have a ratio of $T_1/T_2$ (spin-lattice relaxation time/spin-spin relaxation time) greater than five. The SLIME pulse sequence can also be used to eliminate extraneous signals and to detect substances in which the nuclei of interest have a spin-lattice relaxation time $T_1$ greater than one second, even in applications allowing only a limited amount of time for detection, because the SLIME pulse sequence has only a single excitation pulse.

BRIEF DESCRIPTION OF THE DRAWING

The objects, advantages and features of this invention will become readily apparent from the detailed description, when read in conjunction with the accompanying drawing, in which:

FIG. 2B is a representative cumulative NQR echo signal derived from the NQR echo signals shown in FIG. 2A;

FIG. 2C is a timing diagram of a SLIME pulse sequence like the SLIME pulse sequence of FIG. 2A, but with the excitation pulse having a phase opposite the phase of the excitation pulse in the SLIME pulse sequence of FIG. 2A, including representative NQR echo signals;

FIG. 6A is a timing diagram of an implementation of the SLIME pulse sequence in which the excitation pulse has been subdivided into subpulses, including representative NQR echo signals;

FIG. 6B is an enlarged view of the excitation pulse of FIG. 6A;

DETAILED DESCRIPTION OF THE PREFERRED EMBODIMENTS

Figure 1A:
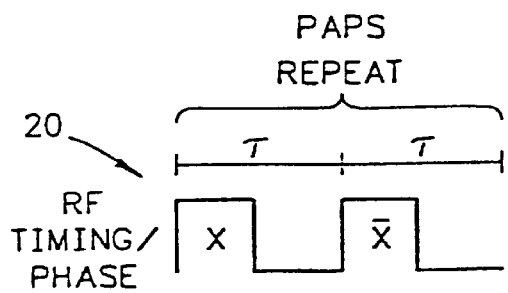
FIG. 1A (prior art) is a graph of a PAPS SSFP pulse sequence.
Figure 1B:
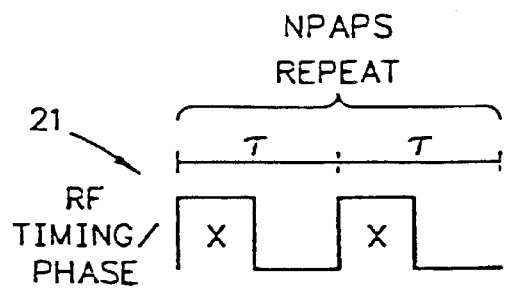
FIG. 1B (prior art) is a graph of a NPAPS SSFP pulse sequence.
Figure 2A:
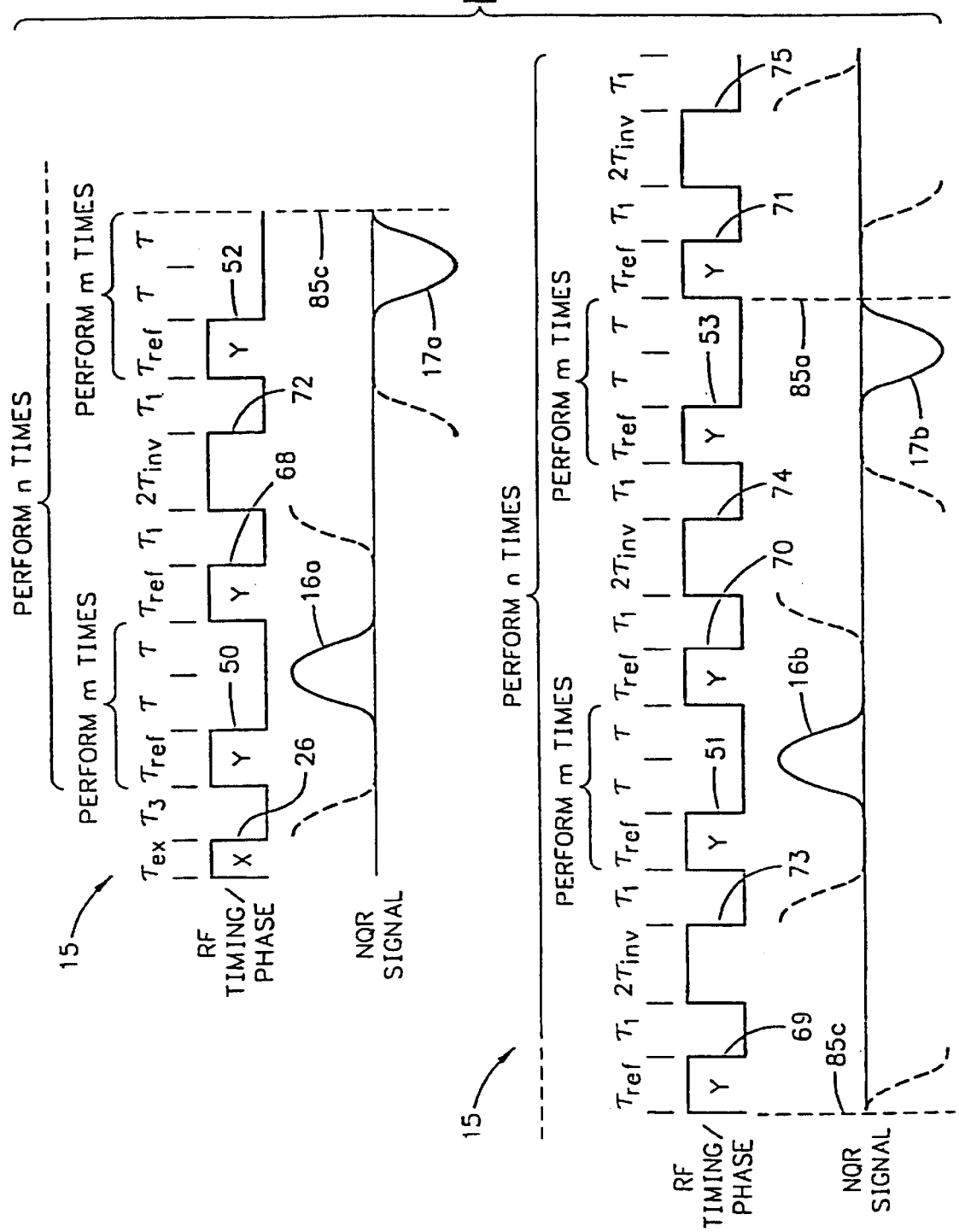
FIG. 2A is a timing diagram of a first embodiment of the SLIME pulse sequence of the present invention, including representative NQR echo signals.

The present invention is a method and system for producing improved NQR echo signals by canceling extraneous signals in a nuclear quadrupole resonance (NQR) system used for the detection of target substances such as explosives and drugs. The method of the present invention includes irradiating a specimen with a series of pulses of electromagnetic radiation, with each pulse having specific characteristics. This pulse sequence is referred to as the spin-locked inversion mid-echo (SLIME) pulse sequence. Different embodiments of the SLIME pulse sequence are illustrated in FIGS. 2A, 2C, 5, 6A, and 7, and are respectively referred to as SLIME pulse sequence 15, 15a, 15b, 15c, and 15d. The embodiments of the SLIME pulse sequence shown in FIGS. 2A, 2C, 6A, and 7 are illustrated as two segments because a single long segment would not fit on a drawing sheet. When a target substance is present in a specimen being tested, the SLIME pulse sequence causes the target substance to generate sets of substantially oppositely-phased NQR echo signals 16a, 16b, 17a, 17b, which are illustrated in FIGS. 2A, 2C, 5, 6A, and 7. Oppositely-phased NQR echo signals are NQR signals with about a one hundred eighty degree (180°) phase difference, which can also be referred to as having opposite polarity. Extraneous signals that have substantially the same phase during the sets of oppositely-phased NQR echo signals 16a, 16b, 17a, 17b are canceled out by subtracting NQR echo signals 17a, 17b having one phase and their corresponding contemporaneous extraneous signals from NQR echo signals 16a, 16b having the opposite phase and their corresponding contemporaneous extraneous signals. The extraneous signals are referred to as being contemporaneous with NQR signals 16a, 16b, 17a, 17b because they exist in NQR detection system 18 (FIG. 3) during the same periods of time as NQR signals 16a, 16b, 17a, 17b. The invention provides for the cancellation of all such same-phased extraneous signals in the NQR detection system. The canceled signals include extraneous signals received by NQR detection system 18, such as, for example, magneto-acoustic ringing and piezo-electric ringing, and extraneous signals generated in the NQR detection system, such as, for example, baseline offset, and electronic circuit ringing (which may also be referred to as pulse ringdown). Due to the opposite phase of the sets of NQR echo signals, when NQR echo signals 17a, 17b of one phase are subtracted from NQR echo signals 16a, 16b having the opposite phase, the echo signals are effectively added together to produce a cumulative echo signal 19, which is illustrated in FIG. 2B. The cumulative echo signal may also be referred to as the cumulative NQR signal, and may also be referred to as the cumulative RF echo signal when, as is usually the case, it is in the RF band. The SLIME pulse sequence 15, 15a, 15b, 15c, 15d is a modified spin-locked spin-echo (SLSE) pulse sequence, in contrast to the steady state free precession (SSFP) pulse sequences disclosed in Buess '171. FIGS. 1A and 1B respectively show a phase-alternated pulse sequence (PAPS) 20 and a non-phase-alternated pulse sequence (NPAPS) 21, which are the two SSFP pulse sequences used in the method disclosed in Buess '171 for eliminating magneto-acoustic ringing in some NQR applications. In FIGS. 1A and 1B, X represents a reference phase of a pulse of RF waves, $\overline{X}$ represents a phase opposite the X phase, and τ represents the duration of each pulse plus the subsequent waiting time between pulses. The PAPS and NPAPS pulse sequences are each single scan pulse sequences, with each pulse in both the PAPS and NPAPS pulse sequences functioning as an excitation pulse. SSFP pulse sequences, including the PAPS and NPAPS pulse sequences disclosed in Buess '171, are not useful for detecting substances in which the ratio of $T_1/T_2$ (spin-lattice relaxation time/spin-spin relaxation time) is greater than about five, because the amplitudes of the NQR responses of such substances to SSFP pulses are too small to be useful for detection purposes.

Figure 1C:
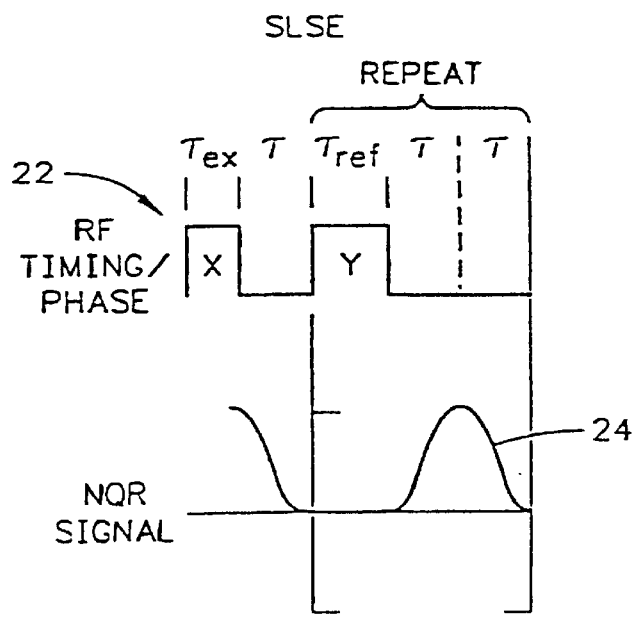
FIG. 1C (prior art) is a graph of a SLSE pulse sequence, including a representative NQR echo signal.

In addition to SSFP pulse sequences, SLSE pulse sequences have been used in NQR detection systems. A representative SLSE pulse sequence 22 is shown in FIG. 1C, in which X represents a reference phase of an excitation pulse of RF waves, Y represents a refocusing pulse having a phase that is about plus or minus ninety degrees from the X phase, $\tau_{ex}$ and $\tau_{ref}$ represent the durations of the respective excitation and refocusing pulses, and τ represents a waiting time. SLSE pulse sequences 22 have been effective for producing NQR echo signals 24, one of which is shown in FIG. 1C. Cancellation of magneto-acoustic ringing or piezo-electric ringing with SLSE pulse sequences has not proven useful primarily because of the time evolution of ringing signals, and a corresponding reduction in the amplitude of the NQR signals.

In order to achieve the detection sensitivity required for most applications, it is necessary to repeat the SSFP or SLSE pulse sequences, which requires additional time. Repeating these pulse sequences requires transmission of new excitation pulses, which necessitates a waiting time between the pulse sequences that is a function of $T_1$. If the waiting time is not adequate, system sensitivity will be degraded. The maximum value of $T_1$ with which SSFP and SLSE pulse sequences can be used for detection is determined by the required level of sensitivity and the amount of time available for detection. For most applications, the required sensitivity cannot be achieved in the time available when $T_1$ is greater than about one second.

In contrast to methods for eliminating magneto-acoustic ringing that require two or more scans of SSFP pulse sequences, the SLIME pulse sequence 15, 15a, 15b, 15c, 15d is a modified SLSE pulse sequence, and only one scan of the SLIME pulse sequence is required to produce NQR signals that can be used to eliminate extraneous signals. Also, in contrast to SSFP pulse sequences, the SLIME pulse sequence 15, 15a, 15b, 15c, 15d has only a single excitation pulse 26. FIG. 2A, which is a timing diagram of a first embodiment of the SLIME pulse sequence, illustrates that the single excitation pulse 26 of the SLIME pulse sequence precedes the remainder of die SLIME pulse sequence. The SLIME pulse sequence produces the desired results after a single transmission of the single excitation pulse. Because a new excitation pulse defines the beginning of a new scan, the SLIME pulse sequence 15, 15a, 15b, 15c, 15d can also be described as producing the desired results after only a single scan. After transmission of single excitation pulse 26, and without the delay that would be incurred if more than one excitation pulse were required or if more than one pulse sequence were required, the entire remainder of the SLIME pulse sequence, and/or portions of the remainder of the SLIME pulse sequence, may be repeated many times. Repetition of these remaining parts of the SLIME pulse sequence causes the generation of numerous oppositely-phased NQR echo signals 16a, 16b, 17a, 17b, which improves system sensitivity. Echo signals 17a, 17b of one phase along with contemporaneous extraneous signals are subtracted from echo signals 16a, 16b having the opposite phase along with contemporaneous extraneous signals, to produce the cumulative echo signal 19 and to remove the extraneous signals.

Because the SLIME pulse sequence is not an SSFP pulse sequence, and because the SLIME pulse sequence has a single excitation pulse 26 and produces the desired NQR signals 16a, 16b, 17a, 17b after a single scan, SLIME pulse sequence 15, 15a, 15b, 15c, 15d can be used to detect a wide variety of substances. The SLIME pulse sequence can be used to detect substances in which the quadrupolar nuclei of interest have a ratio of $T_1/T_2$ greater than (as well as less than) about five, and a value of $T_1$ greater than (as well as less than) about one second.

The target substances to be detected with the method and system of the present invention can be any substances containing quadrupolar nuclei, although the preferred application of the present invention is for the detection of explosives, and/or drugs, containing quadrupolar nuclei. Often the target substances to be detected will be explosives and drugs that contain the quadrupolar nucleus $^{14}N$, due to the existence of $^{14}N$ in many of these substances. The present invention is uniquely useful for the cancellation of extraneous signals during the detection of substances in which the quadrupolar nuclei have ratios of $T_1/T_2$ greater than five, and/or $T_1$ times greater than one second, as discussed above, such as $^{14}N$ in 2,2-bis[(ni-troxy)methyl]-1,3-propanediol, dinitrate (PETN).

Each quadrupolar nucleus has unique NQR resonance frequencies in each substance in which the quadrupolar nucleus is present, and may also have different unique frequencies in inequivalent sites of a single substance. For example, the NQR resonant frequencies of $^{14}N$ in PETN are different from the NQR resonant frequencies of $^{14}N$ in cocaine. Due to the abundance of quadrupolar $^{14}N$ nuclei in explosives and drugs, and quadrupolar $^{35}Cl$ and $^{37}Cl$ nuclei in drugs, the frequency of the electromagnetic pulses in the SLIME pulse sequence 15, 15a, 15b, 15c, 15d is often chosen to correspond with an NQR resonant frequency of $^{14}N$, $^{35}Cl$, or $^{37}Cl$ in a target substance. For example, if the target substance is PETN, the specimen will be irradiated with the SLIME pulse sequence, with the frequency of the electromagnetic waves being about equal to one of several NQR frequencies of $^{14}N$ in PETN, preferably its $v_+$ frequency. NQR resonant frequencies are observed primarily in the RF band of electromagnetic waves. Therefore, the electromagnetic waves in the pulses of the SLIME pulse sequence will generally be in the RF band, although the SLIME pulse sequence could also be used with other frequency bands.

Figure 3:
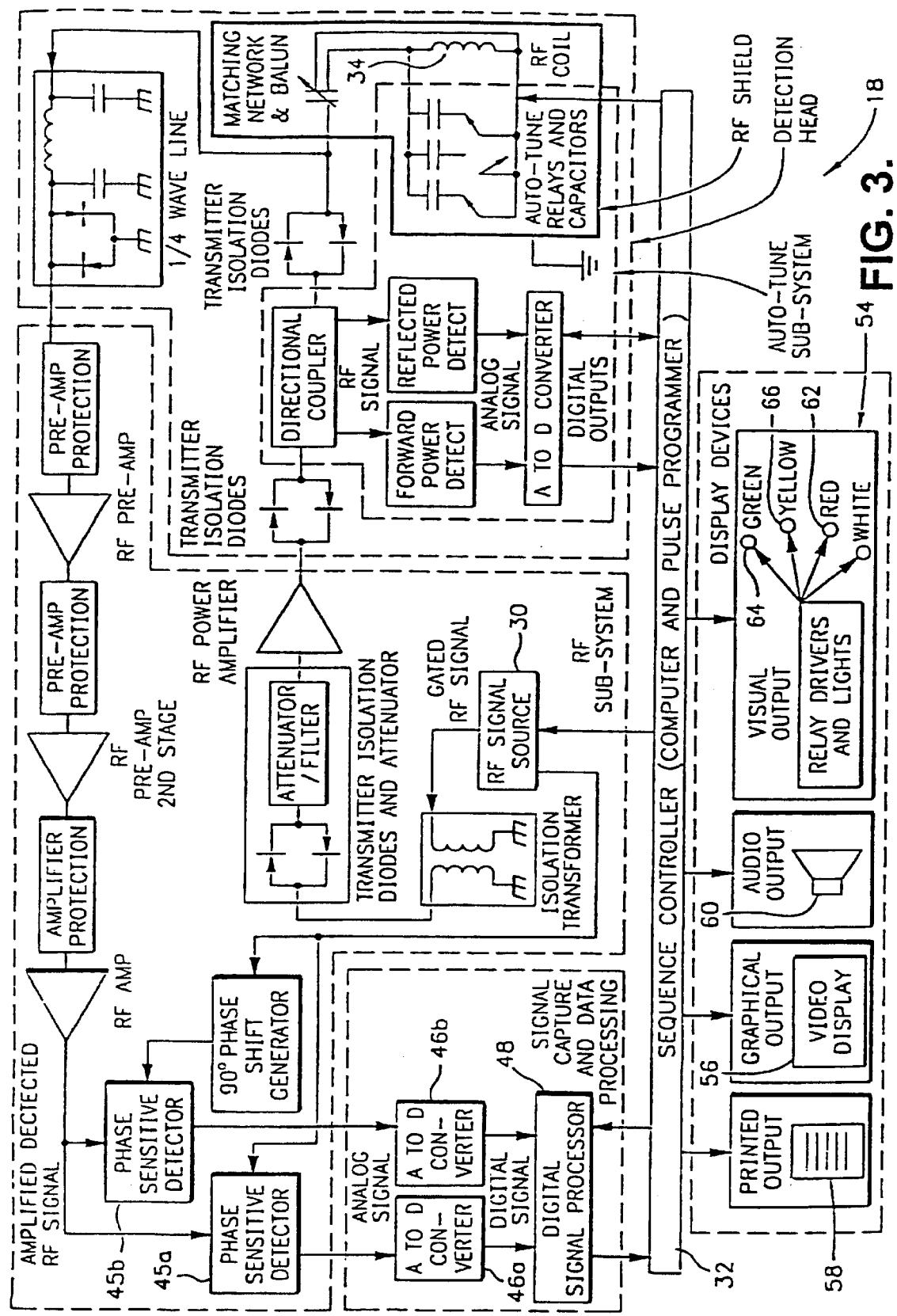
FIG. 3 is a block diagram of an NQR detection system of the present invention.

In the preferred embodiment, the NQR detection system 18 illustrated in FIG. 3 excites NQR resonant frequencies one at a time. In an alternative embodiment, two or more substantially different NQR frequencies could be excited simultaneously, by transmitting SLIME pulse sequences at different NQR resonant frequencies during the same period of time, or during overlapping periods of time.

In the preferred embodiment of the SLIME pulse sequence, the frequency of the electromagnetic waves is substantially constant throughout the SLIME pulse sequence, with the frequency being about equal to an expected NQR frequency of a quadrupolar nucleus in the substance to be detected. In alternative embodiments of the SLIME pulse sequence, which are discussed below, the frequency of some or all of the pulses is modulated over a range of frequencies near an expected NQR frequency of a quadrupolar nucleus in the substance to be detected.

Typically, a specimen will be tested for the presence of more than one target substance by repeating the method of the present invention at NQR frequencies of a quadrupolar nuclei in each substance to be detected. The method of the present invention is also preferably repeated at NQR frequencies of other quadrupolar nuclei, if any, in a single target substance. The method can also be repeated at additional NQR frequencies of a particular quadrupolar nucleus in a target substance.

U.S. Pat. No. 5,592,083 to Magnuson el al ("Magnuson '083"), for a "System A and Method for Contraband Detection Using Nuclear Quadrupole Resonance including a Sheet Coil and RF Shielding Via Waveguide Below Cutoff" is incorporated herein by reference. Magnuson '083 describes NQR contraband detection system 18, shown in FIG. 3, that can be used to implement the method and system of the present invention. Other NQR detection systems could also be used to implement the method and system of the present invention.

Figure 4:
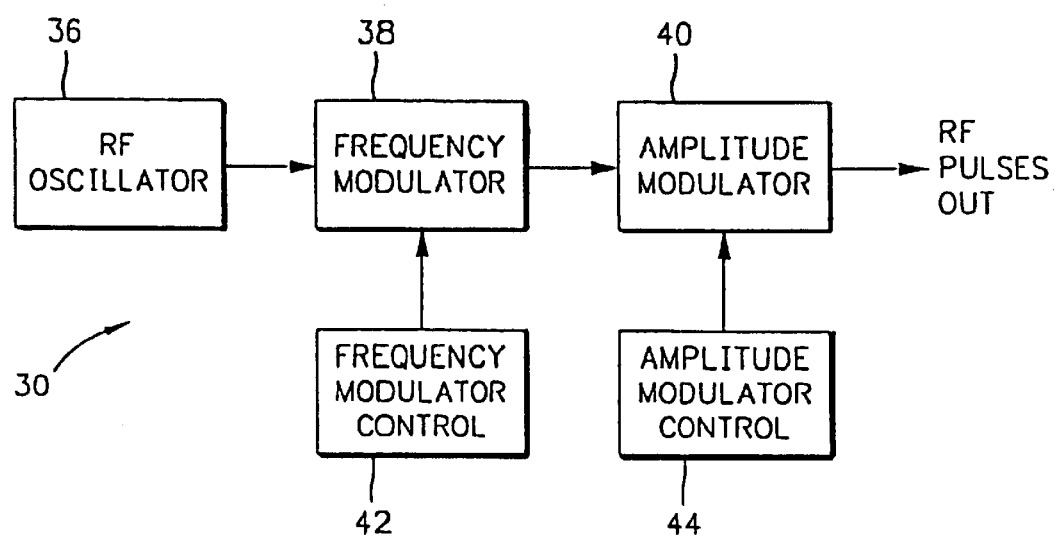
FIG. 4 is a block diagram of an RF signal source of the present invention.

As mentioned above, the method of the present invention includes irradiating the specimen with a sequence of electromagnetic pulses referred to as SLIME pulse sequence 15, 15a, 15b, 15c, 15d. The electromagnetic pulses of the SLIME pulse sequence have specific phases, durations, frequencies, and amplitudes, which are discussed below. The phase, frequency, and amplitude of each pulse is defined by the phase, frequency, and amplitude of the electromagnetic waves in the respective pulse. RF signal source 30 shown in FIG. 3, under the control of computer and pulse programmer (sequence controller) 32, is used to generate pulses of electromagnetic waves, separated by appropriate waiting times, as required for the SLIME pulse sequence. The computer and pulse programmer calculates any time periods required for the SLIME pulse sequence. As illustrated in FIG. 3, and as more fully described in Magnuson '083, the RF waves generated by RF signal source 30 are amplified and transmitted from RF coil 34 into the specimen, which has been placed inside of the RF coil. FIG. 4 is a block diagram showing components of RF signal source 30 used to generate the pulses of the SLIME pulse sequence. RF signal source 30, also referred to as an RF pulse generator, includes RF oscillator 36, frequency modulator 38, amplitude modulator 40, frequency modulator control 42, and amplitude modulator control 44. RF oscillator 36 produces RF electromagnetic waves having constant amplitude and frequency. Frequency modulator 38 and control 42 alter the frequency of the waves from RF signal source 30 in a prescribed manner. Similarly, amplitude modulator 40 and control 44 alter the amplitude of the waves from the RF signal source in a prescribed manner, thus forming the RE pulses.

When a specimen containing a target substance is irradiated with the SLIME pulse sequence with the frequency of the electromagnetic waves in the pulses of the SLIME pulse sequence at or near an NQR resonant frequency of quadrupolar nuclei in the target substance, the quadrupolar nuclei in the target substance generate NQR signals 16a, 16b, 17a, 17b. As more fully described in Magnuson '083, these NQR response signals, along with contemporaneous extraneous signals, such as for example magneto-acoustic ringing, piezo-electric ringing, electronic circuit ringing, and baseline offset, are detected by the NQR detection system. Extraneous signals such as magneto-acoustic ringing and piezo-electric ringing are produced outside of the NQR detection system. Along with the NQR signals 16a, 16b, 17a, 17b, these magneto-acoustic ringing and piezo-electric ringing signals are received by RF coil 34 (FIG. 3), are amplified, and preferably are also inputted into a pair of phase sensitive detectors 45a, 45b (FIG. 3) where they are detected. Alternatively, rather than phase sensitive detectors 45a, 45b, another type of detector or detectors could be used, or other methods of detection known in the art could be used. The signals outputted from phase sensitive detectors 45a, 45b are inputted into analog to digital converters 46a, 46b.

Additional extraneous signals, such as electronic circuit ringing and baseline offset, are produced within the NQR detection system 18. Electronic circuit ringing is produced in the NQR detection system prior to the phase sensitive detectors 45a and 45b, and is detected by the phase sensitive detectors 45a and 45b. In contrast, baseline offset is produced primarily during the analog to digital conversion of the signals that occurs after the signals are outputted from the phase sensitive detectors 45a, 45b, and is thereby detected implicitly as a part of the digitized signals. The digitized signals are processed by a digital signal processor 48. The digital signal processor can be a mainframe computer, a mid-sized computer, a personal computer (PC), a plug in card for a computer, a digital signal processing integrated circuit, or a specialized digital system. Preferably the digital signal processor is a plug in card in a PC.

As mentioned above, irradiation of a target substance with the SLIME pulse sequence of electromagnetic pulses at a frequency near an NQR frequency of quadrupolar nuclei in the target substance causes the quadrupolar nuclei to generate oppositely phased NQR echo signals. NQR echo signals 16a, 16b of one phase are referred to as A NQR signals or A echo signals. NQR echo signals 17a, 17b having a phase about opposite the phase of the A NQR signals 16a, 16b are referred to as B NQR signals or B echo signals. The A and B NQR signals may also be referred to as A RF echo signals and B RF echo signals when, as is usually the case, they are in the RF band. The A and B NQR signals 16a, 16b, 17a, 17b along with extraneous signals that may also be present, are detected and digitized by NQR detection system 18. Then, one or more B NQR signals 17a, 17b and contemporaneous extraneous signals are subtracted from one or more A NQR signals 16a, 16b and contemporaneous extraneous signals, to produce the cumulative NQR signal 19. The subtraction cancels out extraneous signals in the NQR detection system that have substantially the same phase during both the A and B NQR signals such as, for example magneto-acoustic ringing, piezo-electric ringing, electronic circuit ringing, and baseline offset. Due to the opposite phase of the A and B NQR signals, when B NQR signals 17a, 17b are subtracted from A NQR signals 16a, 16b, the signals in effectively add together, resulting in the cumulative NQR signal 19. If the target substance is not present in the specimen, then NQR will not occur, and consequently the A and B NQR signals, as well as the cumulative NQR signal 19, will all be zero.

Extraneous signals produced by magneto-acoustic ringing are near the frequency of, and are in phase with, the applied RF magnetic field, and can have amplitudes comparable to or even much greater than NQR signals 16a, 16b, 17a, 17b. It is believed that the magneto-acoustic ringing continues at the frequency and phase of the pulse that initially excites the ringing, regardless of the phases and frequencies of subsequently transmitted RF pulses. Extraneous signals produced by piezo-electric ringing and electronic circuit ringing are also near the frequency of, and are in phase with, the applied RF magnetic field.

The present invention can be used to cancel out any extraneous signals that have substantially the same phase during both the A and B NQR signals such as, for example, magneto-acoustic ringing, piezo-electric ringing, electronic circuit ringing, and baseline offset. Baseline offset signals, which are analogous to a direct current (DC) offset, have the same polarity during both the A and B NQR signals which, for purposes of cancellation of the baseline offset signals, is equivalent to having the same phase during both the A and B NQR signals. The extraneous signals are generally caused by preceding RF pulses that have been transmitted by NQR detection system 18. Canceling out these artifacts greatly enhances the reliability of the NQR detection system because, if not canceled out, magneto-acoustic ringing signals and piezo-acoustic ringing signals can be mistaken for NQR signals transmitted from target substances. Electronic circuit ringing and baseline offset also introduce signal errors that contribute to misidentification of target substances.

The method and system of the present invention accomplish cancellation of the extraneous signals regardless of which phase of echo signals is designated A and which phase is designated B, and regardless of whether the B echo signals are subtracted from the A echo signals, or the A echo signals are subtracted from the B echo signals. Hence, the positive echo signals may be designated A and the negative echo signals designated B, or vice versa. Preferably, the cumulative echo signal 19 is produced by subtracting B echo signals 17a, 17b from A echo signals 16a, 16b.

Any suitable method may be used to accomplish the subtractions required to cancel out the extraneous signals and produce the cumulative echo signal. As discussed more fully below, preferably during each performance of the portion of the SLIME pulse sequence after the excitation pulse and the waiting time of $\tau_3$, the first refocusing pulse 50 (FIG. 2A) is transmitted m times to produce m A echo signals 16a, and the fifth refocusing pulse 51 is also transmitted m times to produce an additional m A echo signals 16b. Similarly, preferably the third refocusing pulse 52 is transmitted m times to produce m B echo signals 17a, and the seventh refocusing pulse 53 is also transmitted m times to produce an additional m B echo signals 17b. The value of m can range from one (1) to about one hundred thousand (100,000), and if preferably equals about 102. The value of m can be different for each of these refocusing pulses, although preferably the value of m is the same and each of these refocusing pulses is transmitted the same number of times. As described below, the preferred embodiment of the SLIME pulse sequence includes additional acts that result in the production of the A echo signals 16b and the B echo signals 17b. If these additional acts are not performed, then the calculation of the cumulative echo signal described below is accomplished with only A echo signals 16a and B echo signals 17a.

The two sets of m A echo signals 16a, 16b and contemporaneous extraneous signals, and the two sets of m B echo signals 17a, 17b and contemporaneous extraneous signals are detected by the NQR detection system. One or more echo signals in each set of m echo signals 16a, 16b, 17a, 17b, are not used as data because of corruption of these signals by ringdown caused by the preceding excitation or inverting pulse. Preferably, the first two echo signals in each set are discarded. The echo signals that are not used are preferably received but not digitized by the NQR detection system. Alternatively, these unused echo signals could be digitized. In another alternative embodiment, these unused echo signals need not even be received by the NQR detection system.

Preferably, the m minus two remaining echo signals from each set of m echo signals 16a, 16b, 17a, 17b, are divided into the same number of groups of equal at numbers of echo signals. In the preferred embodiment, each of the four sets of m minus two echo signals produced during each performance of the portion of the SLIME pulse sequence after the excitation pulse and the waiting time of $\tau_3$ is divided into ten groups of ten echo signals. Alternatively, other groupings, or no groupings could be used, with the subsequently described calculations being adapted accordingly.

The ten echo signals and contemporaneous extraneous signals in each group of ten echo signals are added together and multiplied by a weighting factor. Weighting is employed to increase the signal-to-noise ratio of the cumulative echo signal 19 that is ultimately produced. Because the signal-to-noise ratio of the A and B NQR echo signals decreases with time after transmission of the excitation pulse, the signal-to-noise ratio of the cumulative echo signal is increased by assigning greater weights to the sums of earlier groups of A and B echo signals than to the sums of later groups of A and B echo signals. The weighting factors are chosen so that die weighting assigned to each of the sums of the groups of echo signals generally corresponds with the decay envelope of the echo signals, which is a function of the $T_{2eff}$ time constant of the quadrupolar nuclei in the target substance.

Preferably, the weighting function used is exponential, with the decay constant equal to $T_{2eff}$. Further, the weighting value for the sum of the first group of ten A echo signals is set equal to the weighting value of the sum of the first group of ten B echo signals. Similarly, the weighting value for the sum of the second group of ten A echo signals is set equal to the weighting value of the sum of the second group of ten B echo signals, and so forth. Accordingly, the weight assigned to the sum of each group of ten A echo signals 16a, 16b and contemporaneous extraneous signals is equal to the weight assigned to the sum of the ten sequentially corresponding B echo signals 17a, 17b and contemporaneous extraneous signals, with each weighting factor being less than the preceding weighting factors. This matched filter weighting results in the weighting factors becoming progressively smaller at an exponential rate. The progressive decrease in lie values of the weighting is continued from the initial performance through all subsequent iterations of the portion of the SLIME pulse sequence after the excitation pulse and the waiting time of $\tau_3$.

Optionally, the weighting factors also include ant additional weighting factor that generally corresponds with the reduction in the amplitude of the A and B echo signals after each inverting pulse. The same additional weighting factor is applied both to each sequentially corresponding ten groups of A echo signals 16a, 16b and contemporaneous extraneous signals, and to each sequentially corresponding ten groups of B echo signals 17a, 17b and contemporaneous extraneous signals. Progressively smaller additional weighting factors are applied to subsequent sets of ten groups of A echo signals 16a, 16b and contemporaneous extraneous signals, and ten groups of B echo signals 17a, 17b and contemporaneous extraneous signals.

In the preferred embodiment the following operations are carried out to subtract the B echo signals 17a, 17b and contemporaneous extraneous signals from the A echo signals 16a, 16b and contemporaneous signals, in order to calculate the cumulative echo signal and to cancel out the extraneous signals. First, the weighted sum of the first group of ten A echo signals and contemporaneous extraneous signals is placed in an accumulation register. Then, the weighted sum of the first group of ten B echo signals and contemporaneous signals is subtracted from the value in the accumulation register. Next, the weighted sum of the second group of ten A echo signals and contemporaneous extraneous signals is added to the value in the accumulation register. The weighted sum of the second group of ten B echo signals and contemporaneous extraneous signals is then subtracted from the value in the accumulation register. The process of adding the weighted sums of groups of ten A echo signals and contemporaneous extraneous signals to the value in the accumulation register and subtracting the weighted sums of groups of ten B echo signals and contemporaneous extraneous signals from the value in the accumulation register is continued in this fashion. This process is continued until all of the weighted sums of the groups of ten A echo signals and contemporaneous extraneous signals have been added to the value in the accumulation register and all of the weighted sums of the groups of ten B echo signals and contemporaneous extraneous signals have been a subtracted from the value in the accumulation register. This process can equivalently be described as calculating the sum of the weighted sums of the groups of ten A echo signals and contemporaneous extraneous signals and the negative of the weighted sums of the groups of ten B echo signals and contemporaneous extraneous signals. The final value in the accumulation register is the cumulative echo signal, with the extraneous signals canceled out. Matched filter weighting, which is a function of $T_2^*$ for the quadrupolar nuclei in the substance to be detected, is preferably applied to the cumulative echo signal to improve the quality of the cumulative echo signal.

Alternatively, other mathematically equivalent methods of subtracting the B echo signals and contemporaneous extraneous signals from the A echo signals and contemporaneous extraneous signals could be employed. For example, in one alternative embodiment all of the weighted sums of the groups of A echo signals and contemporaneous extraneous signals could be added together, and all of the weighted sums of the groups of B echo signals could be added together. Next, to produce the cumulative echo signal and to cancel out the extraneous signals, the sum of the weighted sums of the groups of B echo signals and contemporaneous extraneous signals would be subtracted from the sum of the weighted sums of the groups of A echo signals and contemporaneous extraneous signals. In another alternative embodiment, the sets of m minus two echo signals would not be divided into groups, and each individual B echo signal 17a, 17b and contemporaneous extraneous signals would be weighted and subtracted from a weighted A echo signal 16a, 16b and contemporaneous extraneous signals. The results of these subtractions would be added together to produce the cumulative echo signal and to cancel out the extraneous signals.

Digital signal processor 48 is used to perform the additions, subtractions, weighting (multiplication) and any other mathematical operations on the digitized A and B echo signals required to produce cumulative echo signal 19. Although not preferred, alternatively it may be possible to accomplish these operations with analog addition, subtraction, and multiplication of the analog A and B echo signals.

After the cumulative echo signal is calculated, at least one known characteristic of NQR signals from at least one target substance is compared with at least one characteristic of the cumulative echo signal to determine the presence of the target substance, the absence of the target substance, or possibly an indeterminate result. The comparison of signal characteristics is accomplished with digital signal processor 48. Preferably, to facilitate the comparison of signal characteristics, the Fourier transform of the cumulative echo signal is calculated by the digital signal processor and the signal characteristics are compared in the frequency domain. Alternatively, instead of, or in addition to comparing the Fourier transform of the cumulative echo signal with known characteristics of NQR signals in the frequency domain, the cumulative echo signal could be compared with known characteristics of NQR signals in the time domain.

Preferably, digital signal processor 48 includes a memory for storing the known characteristics of NQR signals from quadrupolar nuclei in target substances that are compared with the cumulative echo signal. These known characteristics could be stored on magnetic tape, punched cards, memory integrated circuits, floppy discs, hard drives, magneto-optical discs, optical discs, or on any other type of data storage device or storage medium. Any of these data storage devices could be considered as part of, or distinct from, the digital signal processor memory.

In the preferred embodiment, comparison of the characteristics of the cumulative echo signal with known characteristics of NQR signals from target substances comprises determining whether the cumulative echo signal includes a component above a threshold level in a frequency band about centered around a known NQR frequency of a quadrupolar nucleus in a target substance. Although wider frequency bands could be used, the frequency band will generally not be wider than about twenty kilohertz, and preferably will be about two kilohertz wide. This comparison may also be described as a comparison of the amplitude as a function of frequency of the cumulative echo signal with known amplitude as a function of frequency NQR responses of quadrupolar nuclei in target substances.

Due to the characteristics of the SLIME pulse sequence and the NQR detection system, the method and system of the present invention are inherently less sensitive to NQR signals having time constants that substantially differ from the time constants of quadrupolar nuclei in the target substances to be detected. For example, the method and system of the present invention are less sensitive to NQR signals that have values of $T_{2eff}$ that substantially differ from the value of $T_{2eff}$ used in the weighting function applied to the groups of A and B echo signals. Likewise, the method and system of the present invention are less sensitive to NQR signals that have values of $T_2^*$ that substantially differ from the value of $T_2^*$ used in the weighting function applied to the cumulative echo signal.

In an alternative embodiment, in addition to analyzing the frequency components of the cumulative echo signal, time constants of the cumulative echo signal could also be directly compared with known NQR time constants of target substances to determine the presence of the target substances. For example, the spin-lattice relaxation time $T_1$, the spin-spin relaxation time $T_2$, the free induction decay (FID) decay time constant $T_2^*$, and the echo train decay time constant $T_{2eff}$ of the cumulative echo signal could be compared with known $T_1$, $T_2$, $T_2^*$ and $T_{2eff}$ values of quadrupolar nuclei in target substances. As more fully described in Magnuson '083, other characteristics of the cumulative echo signal can be further analyzed and compared to known characteristics of quadrupolar nuclei in target substances. If desired, a combination of signal characteristics may be compared. Preferably, the process of comparing the cumulative echo signal with known NQR signal characteristics is repeated with additional cumulative echo signals acquired by transmitting the SLIME pulse sequence at additional NQR frequencies of the same or other target substances.

The output of digital signal processor 48 is connected to display/indicator devices, which are preferably lights 54. Optionally, the display/indicator devices could include a graphical display such as video display 56, a printer 58, a speaker 60, and/or the display of an associated piece of equipment, such as an X-ray machine (not shown). Lights 54 include red light 62 to indicate the presence of a target substance, green light 64 to indicate the absence of a target substance, and yellow light 66 to warn of an indeterminate result. Video display 56 may be used to display signal and NQR detection system characteristics and printer 58 may be used to provide a printed output of signal and NQR detection system characteristics, in addition to indicating the presence or absence of a target substance or an indeterminate result. Speaker 60 may be used, for example, to audibly indicate the presence of a target substance, the absence of a target substance, or an indeterminate result.

As mentioned above, FIG. 2A is a timing diagram of an implementation of the SLIME pulse sequence. FIG. 2A also shows representative A echo signals 16a, 16b, and B echo signals 17a, 17b, and FIG. 2B shows the resulting cumulative echo signal 19. A number of different parameters and terms are shown that are used to define the ay SLIME pulse sequence. A reference phase of a pulse of electromagnetic waves transmitted into the specimen is represented by X. The phase of a pulse of electromagnetic waves that is about opposite the phase of the X reference phase is represented by $\overline{X}$. The symbol Y represents the phase of a pulse of electromagnetic waves that is within a range from plus about one hundred degrees to plus about eighty degrees from the X phase, or within a range from minus about one hundred degrees to minus about eighty degrees from the X phase, preferably about plus or minus ninety degrees from the X phase. The symbol $\overline{Y}$ represents the phase of a pulse of electromagnetic waves that is about opposite the Y phase. As mentioned above, the phase of each pulse is defined by the phase of the electromagnetic waves in the respective pulse. If the phase of the electromagnetic waves is modulated within a pulse, the phase of the pulse is defined as the initial phase of the electromagnetic waves in the pulse.

Figure 7:
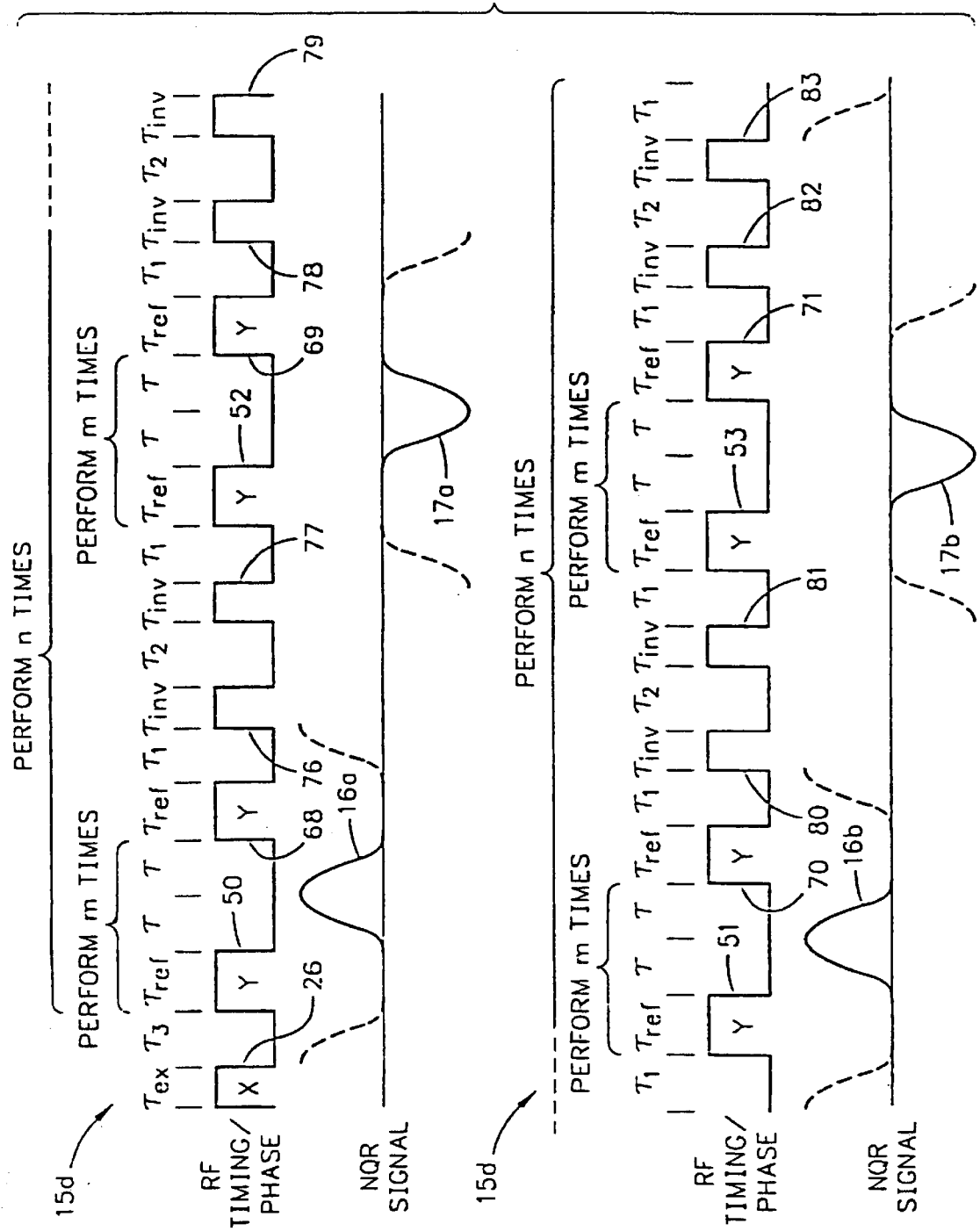
FIG. 7 is a timing diagram of the preferred embodiment of the SLIME pulse sequence, including representative NQR echo signals, in which the first, second, third, and fourth inverting pulses have been subdivided into two subpulses each.

Particular periods of time are represented in FIGS. 2A and 7 by $\tau$, $\tau_1$, $\tau_2$, $\tau_3$, $\tau_{ex}$, $\tau_{ref}$, and $\tau_{inv}$. Excitation is abbreviated as "ex," "ref" is an abbreviation of refocusing, and "inv" is an abbreviation of inverting. Preferably $\tau_1$ equals $\tau$, but $\tau_1$ may be up to about one hundred percent shorter or about one hundred percent longer than $\tau$. Preferably, $\tau_3$ equals $\tau$, but $\tau_3$ may be about fifty percent shorter or about fifty percent longer than $\tau$ in order to adjust the positioning of the echoes. Preferably, $\tau_{inv}$ is about equal to $\tau_{ex}$. The time $\tau_2$ can range from zero to about $2\tau$.

The duration of $\tau_{ex}$ is chosen to produce the optimal flip angle of nuclei to maximize the amplitude of the resulting NQR signals 16a, 16b, 17a, 17b during data acquisition. For an ideal, rectangular (also referred to as square) electromagnetic pulse of constant phase, the preferred value of $T_{ex}$ is about $0.66\pi/\gamma_n B_1$, where $\gamma_n$ is the magnetogyric ratio of the nuclei of interest (for example, $^{14}N$) and $B_1$ is the amplitude of the RF excitation magnetic field. For a non-rectangular pulse, for example an amplitude modulated pulse, preferably the value of $\tau_{ex}$ is chosen to satisfy the equation $$\int_0^{\tau_{ex}} B_1 dt = 0.66\pi/\gamma_n,$$

with $$\int_0^{\tau_{ex}} B_1 dt$$

being referred to as the integrated area of the pulse. Acceptable values of $\tau_{ex}$ are within about ±50% of $0.66\pi/\gamma_n B_1$, for a rectangular pulse, or about ±50% of the value determined from the equation $$\int_0^{\tau_{ex}} B_1 dt = 0.66\pi/\gamma_n$$

for a non-rectangular pulse.

The duration of $\tau_{ref}$ is also chosen to produce the optimal flip angle of nuclei to maximize the amplitude of the resulting NQR signals 16a, 16b, 17a, 17b during data acquisition. For an ideal, rectangular electromagnetic pulse of constant phase, the preferred value $\tau_{ref}$ is about $0.837\pi/\gamma_n B_1$. For a non-rectangular pulse, for example an amplitude modulated pulse, preferably the value of $\tau_{ref}$ is chosen to satisfy the equation $$\int_0^{\tau_{ref}} B_1 dt = 0.83\pi/\gamma_n,$$

with $$\int_0^{\tau_{ref}} B_1 dt$$

being referred to as the integrated area of the pulse. Acceptable values of $\tau_{ref}$ are within about ±80% of $0.83\pi/\gamma_n B_1$ for a rectangular pulse, or about ±80% of the value determined from the equation $$\int_0^{\tau_{ref}} B_1 dt = 0.83\pi/\gamma_n$$

for a non-rectangular pulse. The values of $\tau_{ex}$ and $\tau_{ref}$ are also preferably chosen to be much less than the value of $T_2^*$ for the quadrupolar nuclei in the target substance, for example one-tenth the value of $T_2^*$.

The value of $B_1$ is preferably about two gauss (g), and may range from about twenty milligauss to about twenty gauss. As illustrated in FIG. 2A, typically excitation pulse 26, refocusing pulses 50, 51, 52, 53, 68, 69, 70, 71 and inverting pulses 72, 73, 74, 75 will have about equal amplitudes, producing values of $B_1$ that are about equal, although this is not required.

Typical parameter values for representative SLIME pulse sequences 15, 15a, 15b, 15c, 15d shown respectively in FIGS. 2A, 2C, 5, 6A and 7 are as follows:

$\tau_{ex}$ can range from about one (1) microsecond to about ten (10) milliseconds, and preferably equals about four hundred eighty (480) microseconds.

$\tau_{ref}$ can range from about one (1) microsecond to about ten (10) milliseconds, and preferably equals about seven hundred (700) microseconds.

$\tau_{inv}$ can range from about one (1) microsecond to about ten (10) milliseconds, and preferably equals about four hundred eighty (480) microseconds.

$\tau$ can range from about one (1) microsecond to about one hundred (100) milliseconds, and preferably equals about six hundred seventy-six (676) microseconds.

$\tau_1$ can range from about zero (0) microseconds to about one hundred (100) milliseconds, and preferably equals $\tau$.

$\tau_2$ can range from about zero (0) microseconds to about one hundred (100) milliseconds, and preferably equals about seven hundred eighty-six (786) microseconds.

$\tau_3$ can range from about one (1) microsecond to about one hundred (100) milliseconds, and is less than or equal to $2\tau$. $\tau_3$ is preferably equal to $\tau$.

m can range from one (1) to about one hundred thousand (100,000), and preferably equals about one hundred two (102), as mentioned above.

n can range from one (1) to about one hundred thousand (100,000), and preferably equals about eight (8). Preferably, n will be an integer, although n can have a fractional value if the SLIME pulse sequence is terminated at an intermediate point.

As mentioned above, a first embodiment of SLIME pulse sequence 15 is illustrated in FIG. 2A. This embodiment begins with irradiating the specimen with excitation pulse 26 having a phase of about X, and a duration of about $\tau_{ex}$, and then waiting a time of about $\tau_3$. Next, at least once, the specimen is irradiated with first refocusing pulse 50 having a phase of about Y, and duration of about $\tau_{ref}$. During a time of about $2\tau$ immediately after each time the specimen is irradiated with the first refocusing pulse 50, an A echo signal 16a transmitted from the specimen, if any, is received by NQR system 18. The A echo signal will be transmitted from the specimen only if the target substance is present in the specimen. Extraneous signals such a magneto-acoustic ringing and piezo-electric ringing, if any, will also be received during the time of about $2\tau$ when the A echo signal is being received. Preferably, the act of irradiating the specimen with the first refocusing pulse and receiving the A echo signal is performed m times before advancing to the next pulse in the SLIME pulse sequence. This act is repeated in order to cause the target substance to generate m A echo signals that are then received by the NQR detection system, which are used to increase the signal-to-noise ratio and thereby improve the sensitivity and reliability of the NQR detection system, compared to when fewer A echo signals are obtained.

In the first embodiment the specimen is next irradiated with second refocusing pulse 68 having a phase of about Y, and a duration of about $\tau_{ref}$, which is followed by a waiting time of about $\tau_1$. Next, the specimen is irradiated with a first inverting pulse 72 having a phase of about X or about $\overline{X}$, and a duration of about $2\tau_{inv}$, which is followed by a waiting time of about $\tau_1$. Then, at least once, the specimen is irradiated with a third refocusing pulse 52 having a phase of about Y, and a duration of about $\tau_{ref}$. During a time of about $2\tau$ immediately after each time the specimen is irradiated with third refocusing pulse 52, a B echo signal 17a transmitted from the specimen, if any, is received by NQR detection system 18. The B echo signal will be transmitted from the specimen only if the target substance is present in the specimen. Extraneous signals such as magneto-acoustic ringing and piezo-electric ringing, if any, will also be received during the time of about $2\tau$ when the B echo signal is being received. Preferably, the act of irradiating the specimen with the third refocusing pulse 52 and receiving the B echo signal is performed m times before advancing to the next act in the SLIME pulse sequence. This act is repeated in order to cause the target substance to generate m B echo signals, that are received by die NQR detection system and are used to increase the signal-to-noise ratio of the NQR detection system. Finally, after the B echo signals are received, one or more B echo signals 17a, and contemporaneous extraneous signals are subtracted from one or more A echo signals 16a and contemporaneous extraneous signals to produce cumulative echo signal 19 and to cancel out the extraneous signals, as described above.

Preferably, the first embodiment of the SLIME pulse sequence also includes the following additional acts, after the last iteration of the act of irradiating the specimen with third refocusing pulse 52 and receiving the B echo signal 17a, if any. The additional acts of the first embodiment are performed prior to calculation of the cumulative echo signal and cancellation of the extraneous signals, and are preferably performed prior to subtracting any B echo signals and contemporaneous extraneous signals from any A echo signals and contemporaneous extraneous signals. The additional acts include irradiating the specimen with fourth refocusing pulse 69 having a phase of about Y, and a duration of about $\tau_{ref}$, followed by a waiting time of about $\tau_1$. Next, the specimen is irradiated with a second inverting pulse 73 having a phase of about X or about $\overline{X}$, and a duration of about $2\tau_{inv}$, followed by a waiting time of about $\tau_1$.

The additional acts in the first embodiment also include, at least once, irradiating the specimen with fifth refocusing pulse 51 having a phase of about Y, and a duration of about $\tau$ref. During a time of about $2\tau$ immediately after each time the specimen is irradiated with the fifth refocusing pulse, an A echo signal 16b transmitted from the specimen, if any, and extraneous signals, if any, are received by NQR detection system 18. Preferably, the act of irradiating the specimen with the fifth refocusing pulse 51 and receiving the A echo signal 16b is performed m times before advancing to the next pulse in the SLIME pulse sequence.

The additional acts of the first embodiment also include irradiating the specimen with sixth refocusing pulse 70 having a phase of about Y, and a duration of about $\tau_{ref}$, followed by a waiting time of about $\tau_1$. Next, the specimen is irradiated with a third inverting pulse 74 having a phase of about X or about $\overline{X}$, and a duration of about $2\tau_{inv}$, followed by a waiting time of about $\tau_1$ Next, at least once, the specimen is irradiated with seventh refocusing pulse 53 having a phase of about Y, and a duration of about $\tau_{ref}$. During a time of about $2\tau$ immediately after each time the specimen is irradiated with the seventh refocusing pulse, a B echo signal 17b transmitted from the specimen, if any, and extraneous signals, if any, are received by the NQR detection system. Preferably, the act of irradiating the specimen with seventh refocusing pulse 53 and receiving the B echo signal is performed m times a before advancing to the next act in the SLIME pulse sequence.

Figure 5:
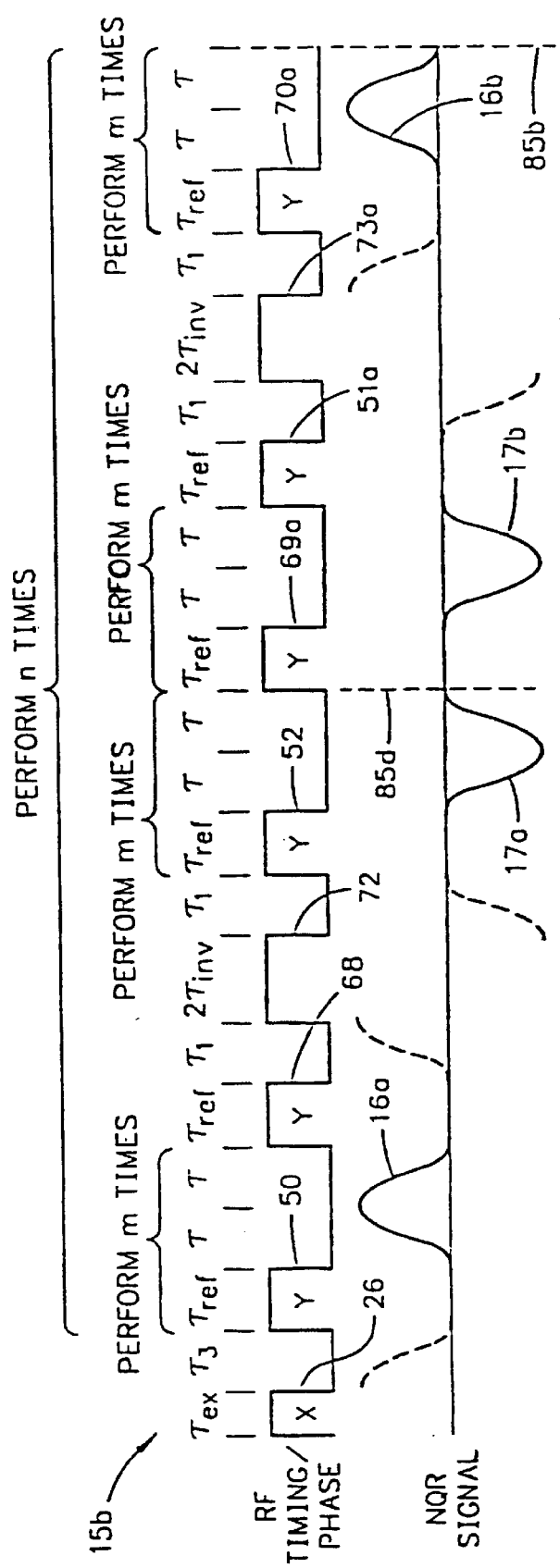
FIG. 5 is a timing diagram of a second embodiment of the SLIME pulse sequence of the present invention, including representative NQR echo signals.

A second, alternative embodiment of the SLIME pulse sequence is illustrated in FIG. 5 and is designated 15b. The second embodiment is identical to the first embodiment until after the last iteration of the act of irradiating the specimen with the third refocusing pulse 52 and receiving the B echo signal 17a and extraneous signals, if any, during the time of about $2\tau$ immediately after each time the specimen is irradiated with the third refocusing pulse 52. The additional acts of the second embodiment are performed prior to calculation of the cumulative echo signal and cancellation of the extraneous signals, and are preferably performed prior to subtracting any B echo signals and contemporaneous extraneous signals from any A echo signals and contemporaneous extraneous signals. The additional acts of the second embodiment begin with irradiating the specimen with fourth refocusing pulse 69a having a phase of about Y, and a duration of about $\tau_{ref}$. During a time of about $2\tau$ immediately after each time the specimen is irradiated with the fourth refocusing pulse, a B echo signal 17b transmitted from the specimen, if any, and extraneous signals, if any, are received by the NQR detection system. Preferably, the act of irradiating the specimen with the fourth refocusing pulse and receiving a B echo signal is performed m times before advancing to the next act in the SLIME pulse sequence. Next, the specimen is irradiated with fifth refocusing pulse 51a having a phase of about Y, and a duration of about $\tau_{ref}$, followed by a waiting time of about $\tau_1$. Next, the specimen is irradiated with a second inverting pulse 73a having a phase of about X or about $\overline{X}$, and a duration of about $2\tau_{inv}$, followed by a waiting time of about $\tau_1$. The additional acts in the second embodiment also include, at least once, irradiating the specimen with sixth refocusing pulse 70a having a phase of about Y, and a duration of about $\tau_{ref}$. During a time of about $2\tau$ immediately after each time the specimen is irradiated with the sixth refocusing pulse, an A echo signal 16b transmitted from the specimen, if any, and extraneous signals, if any, are received by NQR detection system 18. Preferably, the act of irradiating the specimen with the sixth refocusing pulse and receiving the A echo signal 16b is performed times before advancing to the next pulse in the SLIME pulse sequence.

Preferably, for the first embodiment described above, the SLIME pulse sequence also includes the following further additional acts. These acts are performed after the last iteration of the act of irradiating the specimen with seventh refocusing pulse 53 and receiving the B echo signals 17b, if any. The further additional acts begin with irradiating the specimen with an eighth refocusing pulse 71 having a phase of about Y, and a duration of about $\tau_{ref}$, followed by a waiting time of about $\tau_1$. Next, the specimen is irradiated with a fourth inverting pulse 75 having a phase of about X or about $\overline{X}$, and a duration of about $2\tau_{inv}$, followed by a waiting time of about $\tau_1$. The remainder of the further additional acts for the first embodiment are described below, and entail repeating the entire first embodiment including the additional acts of the first embodiment, except for the excitation pulse and the immediately following waiting time of $\tau_3$.

The second embodiment described above also preferably includes further additional acts. These further additional acts are performed after the last iteration of the act of irradiating the specimen with sixth refocusing pulse 70a and receiving the A echo signals 16b, if any. These further additional acts, which are described below, entail repeating the entire second embodiment including the additional acts of the second embodiment, except for the excitation pulse and the immediately following waiting time of $\tau_3$.

The further additional acts of the first embodiment continue with, and the further additional acts of the second embodiment begin with, at least once, irradiating the specimen again with first refocusing pulse 50 having a phase of about Y, and a duration of about $\tau_{ref}$. During a time of about $2\tau$ immediately after each time the specimen is irradiated with the first refocusing pulse, an A echo signal 16a transmitted from the specimen, if any, and extraneous signals, if any, are received by NQR detection system 18. Preferably, the act of irradiating the specimen with the first refocusing pulse 50 and receiving the A echo signal is performed m times before advancing to the next pulse in the SLIME pulse sequence.

For both the first and second embodiments, the further additional acts also include irradiating the specimen again with second refocusing pulse 68 having a phase of about Y, and duration of about $\tau_{ref}$, followed by a waiting time of about $\tau_1$. Next, the specimen is again irradiated with the first inverting pulse 72 having a phase of about X or about $\overline{X}$, and a duration of about $2T_{inv}$, followed by a waiting time of about $\tau_1$. Next, at least once, the specimen is again irradiated with third refocusing pulse 52 having a phase of about Y, and a duration of about $\tau_{ref}$. During a time of about $2\tau$ immediately after each time the specimen is irradiated with the third refocusing pulse, a B echo signal 17a transmitted from the specimen, if any, and extraneous signals, if any, are received by the NQR detection system. Preferably, the act of irradiating the specimen with third refocusing pulse 52 and receiving the B echo signal is performed m times before advancing to the next act in the SLIME pulse sequence.

For the first embodiment, after the last iteration of the act of irradiating the specimen with third refocusing pulse 52 and receiving the B echo signals 17*a*, if any, the further additional acts also preferably include irradiating the specimen again with fourth refocusing pulse 69 having a phase of about Y, and a duration of about $\tau_{ref}$, followed by a waiting time of about $\tau_1$. Next, the specimen is irradiated with second inverting pulse 73 having a phase of about X or about $\overline{X}$, and a duration of about $2\tau_{inv}$, followed by a waiting time of about $\tau_1$. At least once, the specimen is irradiated again with fifth refocusing pulse 51 having a phase of about Y, and a duration of about $\tau_{ref}$. During a time of about $2\tau$ immediately after each time the specimen is irradiated with the fifth refocusing pulse, an A echo signal 16*b* transmitted from the specimen, if any, and extraneous signals, if any, are received by NQR detection system 18. Preferably, the act of irradiating the specimen with the fifth refocusing pulse 51 and receiving the A echo signal is performed m times before advancing to the next pulse in the SLIME pulse sequence. The specimen is then irradiated again with sixth refocusing pulse 70 having a phase of about Y, and a duration of about $\tau_{ref}$, followed by a waiting time of about $\tau_1$. Next, the specimen is irradiated again with third inverting pulse 74 having a phase of about X or about $\overline{X}$, and a duration of about $2\tau_{inv}$, followed by a waiting time of about $\tau_1$. Next, at least once, the specimen is irradiated again with seventh refocusing pulse 53 having a phase of about Y, and a duration of about $\tau_{ref}$. During a time of about $2\tau$ immediately after each time the specimen is irradiated with the seventh refocusing pulse, a B echo signal 17*b* transmitted from the specimen, if any, and extraneous signals, if any, are received by the NQR detection system. Preferably, the act of irradiating the specimen with seventh refocusing pulse 53 and receiving the B echo signal is performed in times before advancing to the next act in the SLIME pulse sequence. After performance of the further additional acts the desired number of times, or even if the further additional acts are not performed, preferably the first embodiment of the SLIME pulse sequence 15 is terminated at the point indicated by the dashed line 85*a* in FIG. 2A, which is after performing m times the act of irradiating the specimen with the seventh refocusing pulse and receiving the B echo signal 17*b* and extraneous signals, if any. The preferred embodiment of the SLIME pulse sequence 15*d* (FIG. 7), which is discussed below, is also preferably terminated at the point in SLIME pulse sequence 15*d* corresponding with the location of line 85*a* in SLIME pulse sequence 15 in FIG. 2A.

For the second embodiment, after the last iteration of the act of irradiating the specimen with third refocusing pulse 52 and receiving the B echo signals 17*a*, if any, the further additional acts also preferably include irradiating the specimen again with fourth refocusing pulse 69*a* having a phase of about Y, and a duration of about $\tau_{ref}$. During a time of about $2\tau$ immediately after each time the specimen is irradiated with the fourth refocusing pulse, a B echo signal 17*b* transmitted from the specimen, if any, and extraneous signals, if any, are received by the NQR detection system. Preferably, the act of irradiating the specimen with the fourth refocusing pulse and receiving a B echo signal is performed m times before advancing to the next act in the SLIME pulse sequence. Next, the specimen is irradiated with fifth refocusing pulse 51*a* having a phase of about Y, and a duration of about $\tau_{ref}$, followed by a waiting time of about $\tau_1$. Next, the specimen is irradiated with a second inverting pulse 73*a* having a phase of about X or about $\overline{X}$, and a duration of about $2\tau_{ref}$, followed by a waiting time of about $\tau_1$. At least once, the specimen is then irradiated with sixth refocusing pulse 70*a* having a phase of about Y, and a duration of about $\tau_{ref}$. During a time of about $2\tau$ immediately after each time the specimen is irradiated with the sixth refocusing pulse, an A echo signal 16*b* transmitted from the specimen, if any, and extraneous signals, if any, are received by NQR detection system 18. Preferably, the act of irradiating the specimen with the sixth refocusing pulse and receiving the A echo signal 16*b* is performed m times before advancing to the next pulse in the SLIME pulse sequence. After performance of the further additional acts the desired number of times, or even if the further additional acts are not performed, preferably the second embodiment of the SLIME pulse sequence 15*b* is terminated at the point indicated by the dashed line 85*b* in FIG. 5, which is after performing m times the act of irradiating the specimen with the sixth refocusing pulse and receiving the A echo signal 16*b* and extraneous signals, if any.

For both the first and second embodiments, preferably the further additional acts described above are performed n−1 times, so that the portion of the SLIME pulse sequence after excitation pulse 26 and the waiting time of $\tau_3$ is performed a total of n times, as illustrated in FIGS. 2A and 5. Repeating this portion of the SLIME pulse sequence increases the number of data samples, which increases the signal-to-noise ratio and thereby improves the sensitivity and reliability of the NQR detection system. For the first embodiment, preferably, during all of the n performances of the portion of the SLIME pulse sequence after excitation pulse 26 and the waiting time of $\tau_3$, the phase of first inverting pulse 72 and second inverting pulse 73 is $\overline{X}$, and the phase of third inverting pulse 74 and fourth inverting pulse 75 is X. At the end of the final iteration of the first embodiment of the SLIME pulse sequence, eighth refocusing pulse 71 and fourth inverting pulse 75 need not be transmitted. In both the first and second embodiments, preferably, m has the same value throughout each performance of the portion of the SLIME pulse sequence after the excitation pulse and the waiting time of $\tau_3$, and has the same value throughout all of the performances of the SLIME pulse sequence after the excitation pulse and waiting time of $\tau_3$. However, the value of m may vary between performances of the portion of the SLIME pulse sequence after the excitation pulse and the waiting time of $\tau_3$, and may also vary within each performance of the portion of the SLIME pulse sequence after the excitation pulse and the waiting time of $\tau_3$.

In a variation of the first and second embodiments, the SLIME pulse sequence is terminated at the points indicated by dashed line 85*c* in FIG. 2A, or dashed line 85*d* in FIG. 5. The SLIME pulse sequence may be terminated at these points without having performed the additional acts and further additional acts, or may be terminated at these points after performing the additional acts and further additional acts. If the additional acts and further additional acts are performed, this variation is terminated at these points in the further additional acts after performing the further additional acts any number of times, and can even be terminated at these points during the first performance of the further additional acts. Termination at these points may be described as performing the portion of the SLIME pulse sequence after the excitation pulse 26 and the waiting time of $\tau_3$, 0.5 times, 1.5 times, 2.5 times, and so on, depending on whether the additional acts and further additional acts are performed and depending on the number of times that the further additional acts are performed. Thus, when the SLIME pulse sequence is terminated at these points, n may be described as having a value of 0.5, 1.5, 2.5, and so on. The cumulative echo signal is calculated, as described above, after the SLIME pulse sequence is terminated. The other embodiments of the SLIME pulse sequence described herein can similarly be terminated at the points in the SLIME pulse sequence corresponding with line 85c in FIG. 2A and line 85d in FIG. 5. Alternatively, any of the embodiments of the SLIME pulse sequence may be terminated at any point, although this is generally not desirable, because depending on the termination point, unequal numbers of A and B echo signals may have been received, which would inefficiently result in unused A or B echo signals when calculating the cumulative echo signal.

As illustrated in FIGS. 2A, 2C, 5, 6A, and 7, a single scan of SLIME pulse sequence 15, 15a, 15b, 15c, 15d preferably includes repetitions of all of the SLIME pulse sequence except for excitation pulse 26 (26a in FIG. 6A) and the immediately following waiting time of $\tau_3$. A single SLIME pulse sequence includes only one excitation pulse, which is transmitted one time at the beginning of the SLIME pulse sequence, no matter how many times other portions of the SLIME pulse sequence are repeated.

Optionally, in order to achieve improved ringdown cancellation and to generally improve system sensitivity, a second SLIME pulse sequence with the phase of the excitation pulse in the second SLIME pulse sequence about opposite the phase of the excitation pulse in the first SLIME pulse sequence, can be transmitted to produce additional data samples for increased signal averaging. If the second SLIME pulse sequence is transmitted, although not required, preferably the phase of each of the inverting pulses in the second SLIME pulse sequence is about opposite the phase of the corresponding inverting pulse in the first SLIME pulse sequence. To achieve adequate system sensitivity, a minimum waiting time of 0.5 $T_1$, preferably three times $T_1$, of the quadrupolar nuclei to be excited in the target substance is required before beginning the second SLIME pulse sequence. The waiting time is required after completion of transmission of the last pulse transmitted in the first SLIME pulse sequence, for example seventh refocusing pulse 53 illustrated in FIG. 2A or sixth refocusing pulse 70a illustrated in FIG. 5. Accordingly, for most applications the second SLIME pulse sequence can only be utilized in instances where $T_1$ is small, for example less than about one second. The second SLIME pulse sequence can also be used with larger values of $T_1$ in applications where there is sufficient time available for the longer waiting time between the SLIME pulse sequences required by a larger value of $T_1$. After all of the iterations of the first SLIME pulse sequence are completed, and after the required waiting time, the second SLIME pulse sequence, which includes a new excitation pulse, is transmitted. The A and B echo signals from both SLIME pulse sequences are then used to calculate the cumulative echo signal 19.

Due to the opposite phase of the excitation pulse in the second SLIME pulse sequence, the locations of the A and B echo signals are reversed in the second SLIME pulse sequence in comparison to the first SLIME pulse sequence. For example, if the first SLIME pulse sequence is the SLIME pulse sequence 15 illustrated in FIG. 2A, the A echo signals are generated after the first and fifth refocusing pulses, and the B echo signals are generated after the third and seventh refocusing pulses. If the second SLIME pulse sequence is the SLIME pulse sequence 15a illustrated in FIG. 2C, the A echo signals are, in contrast, generated after the third and seventh refocusing pulses and the B echo signals are generated after the first and fifth refocusing pulses. Alternatively, the second embodiment of the SLIME pulse sequence 15b illustrated in FIG. 5 could be used for the first SLIME pulse sequence and the second SLIME pulse sequence, but with the phase of the excitation pulse in the second SLIME pulse sequence being opposite the phase of the excitation pulse in the first SLIME pulse sequence. In this embodiment the locations of the A and B echo signals would also be reversed between these two versions of the SLIME pulse sequence 15b. Alternatively, the first and second SLIME pulse sequences may each be any of the embodiments of the SLIME pulse sequence described herein.

One or more of the pulses in the SLIME pulse sequence can be implemented as two or more separate subpulses. If a pulse is implemented as two or more separate subpulses, the sum of the integrated areas of each of the separate subpulses must be about equal to the required integrated area of the pulse that has been subdivided. The term "pulse" is defined to include a single pulse, or two or more subpulses with the sum of the integrated areas of the subpulses being about equal to the required integrated area of the pulse that has been subdivided. For example, considering rectangular pulses for simplicity, excitation pulse 26c an be implemented as two or more subpulses, with the sum of the $B_1$-duration products of each of the subpulses being about equal to $B_1\tau_{ex}$. Again considering rectangular pulses for simplicity, any of the refocusing pulses 50, 51, 52, 53, 68, 69, 70, 71 can be implemented as two or more subpulses with the sum of the $B_1$-duration products of each of the subpulses being about equal to $B_1\tau_{ref}$. Once again considering rectangular pulses for simplicity, any of the inverting pulses 72, 73, 74, 75 can be implemented as two or more subpulses, with the sum of the $B_1$-duration products of each of the subpulses being about equal to $B_12\tau_{inv}$. An implementation of the SLIME pulse sequence, designated 15c, in which excitation pulse 26a has been subdivided into subpulses, is illustrated in FIG. 6A. FIG. 6B is an enlargement of the excitation pulse 26a of FIG. 6A, illustrating that the sum of the durations a, b, and c of the three subpulses of Id excitation pulse 26a is equal to $\tau_{ex}$. As described below, an implementation of the SLIME pulse sequence in which inverting pulses 72, 73, 74, 75 of FIG. 2A have been subdivided into subpulses is illustrated in FIG. 7.

If a pulse is subdivided into subpulses, the waiting time between the subpulses can range from about 0.1 microseconds to about ten thousand microseconds, and is typically about ten microseconds. A pulse that has been implemented as two or more subpulses is completed after the final subpulse has been transmitted, at which time the next act or section of the SLIME pulse sequence is carried out. If desired, different implementations and combinations of subpulses can be used during different iterations of the SLIME pulse sequence.

A timing diagram of a third embodiment of the SLIME pulse sequence, designated 15d, which is the preferred embodiment of the SLIME pulse sequence, is illustrated in FIG. 7. The preferred embodiment 15d illustrated in FIG. 7 is identical to the first embodiment 15 in FIG. 2A, except that each of the inverting pulses 72, 73, 74, 75 of the embodiment 15 in FIG. 2 has been subdivided into a pair of subpulses in the embodiment 15d in FIG. 7. In the preferred embodiment 15d in FIG. 7, the first inverting pulse 72 (FIG. 2A) is subdivided into two substantially equivalent rectangular subpulses that are referred to as A-first inverting subpulse 76 and B-first inverting subpulse 77, and which each have a duration of about $\tau_{inv}$. The A-first inverting subpulse and the B-first inverting subpulse are separated by a waiting time of about $\tau_2$. Similarly, in the preferred embodiment 15d in FIG. 7, the second inverting pulse 73 (FIG. 2A) is also subdivided into two substantially equivalent rectangular subpulses that are referred to as A-second inverting subpulse 78 and B-second inverting subpulse 79, and which each have a duration of about $\tau_{inv}$. The A-second inverting subpulse and the B-second inverting subpulse are separated by a waiting time of about $\tau_2$. Likewise, in the preferred embodiment 15d in FIG. 7, third inverting pulse 74 (FIG. 2A) is also subdivided into two substantially equivalent rectangular subpulses that are referred to as A-third inverting subpulse 80 and B-third inverting subpulse 81, and which each have a duration of about $\tau_{inv}$. The A-third inverting subpulse and the B-third inverting subpulse are separated by a waiting time of about $\tau_2$. In a similar fashion, in the preferred embodiment 15d in FIG. 7, fourth inverting pulse 75 (FIG. 2A) is also subdivided into two substantially equivalent rectangular subpulses that are referred to as A-fourth inverting subpulse 82 and B-fourth inverting subpulse 83, and which each have a duration of about $\tau_{inv}$. The A-fourth inverting subpulse and the B-fourth inverting subpulse are separated by a waiting time of about $\tau_2$. In this preferred embodiment, the waiting time of $\tau_2$ between the subpulses of the inverting pulses has about the same value between each pair of subpulses.

Alternatively, it is not necessary for the subpulses of first inverting pulse 72 to be substantially identical to each other, or for the subpulses of second inverting pulse 73 to be substantially identical to each other, or for the subpulses of third inverting pulse 74 to be substantially identical to each other, or for the subpulses of fourth inverting pulse 75 to be substantially identical to each other. For example, A-first inverting subpulse 76 could have a longer or shorter duration than B-first inverting subpulse 77, as long as the sum of the durations of tie A-first inverting subpulse and the B-first inverting subpulse is about $2\tau_{inv}$, for rectangular pulses. Also, it is not necessary for the subpulses of any of the inverting pulses to be equivalent to the subpulses of any of the other inverting pulses. The waiting times of $\tau_2$ between the subpulses of the inverting pulses need not be equal, and can have values from zero to about $2\tau$. If desired, different implementations of the inverting pulses described above can be used during different iterations of the SLIME pulse sequence.

Figure 8A:
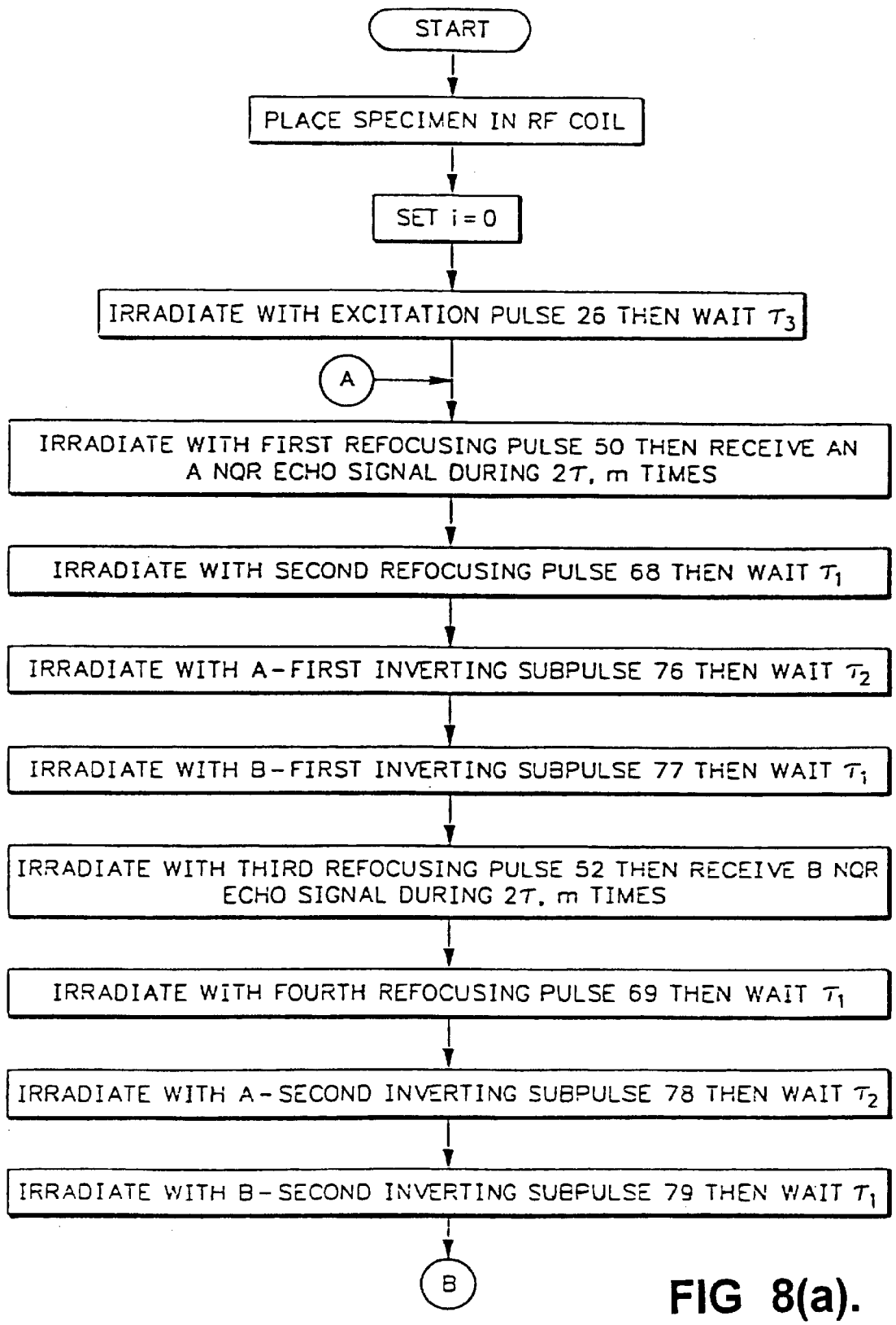
FIG. 8 is a flow chart illustrating the acts of the preferred embodiment of the method of the present invention.
Figure 8B:
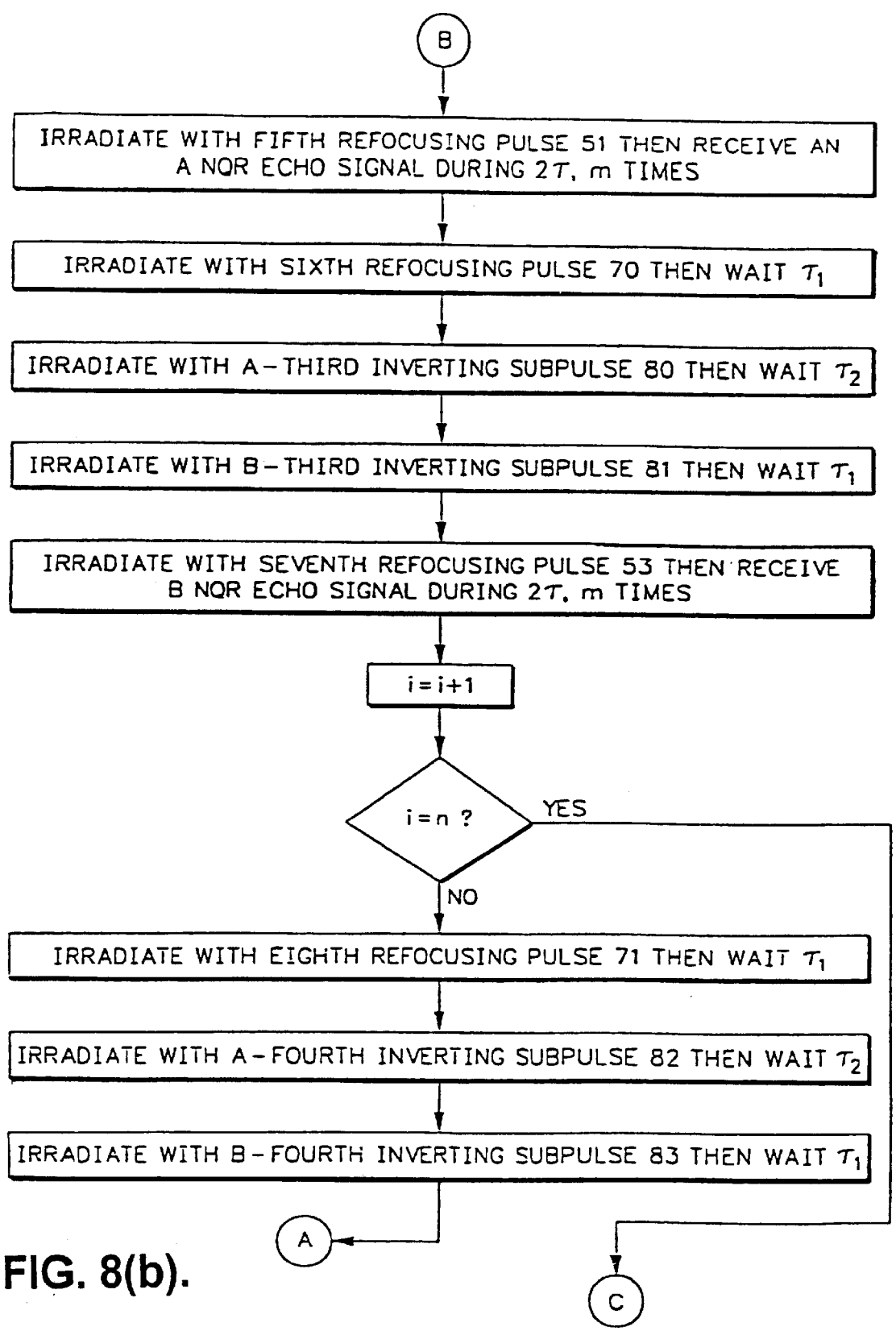
Figure 8C:
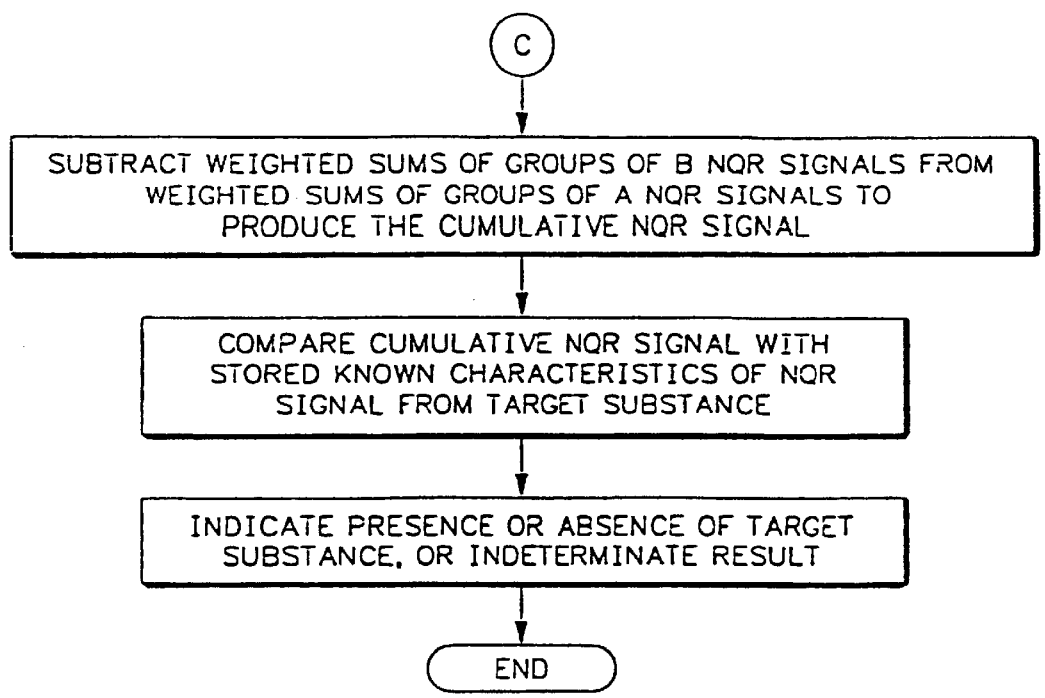

FIG. 8 is a flow chart illustrating the acts of the preferred embodiment of the method of the present invention, discussed above, with reference to the preferred embodiment 15d of the SLIME pulse sequence illustrated in FIG. 7. In FIG. 8, "i" is a dummy variable, that is initially set to have a value of zero, that indicates the number of times that the portion of the SLIME pulse sequence after the excitation pulse and the waiting time of 73 has been performed. The value of "i" is incremented by one (1) for each performance of the portion of the SLIME pulse sequence after the excitation pulse and the waiting time of 73, and can be incremented at any time after being initialized or after previously being compared to the value of "n". During each performance of the portion of the SLIME pulse sequence 15d after the excitation pulse and the waiting time of $\tau_3$, after the last iteration of irradiating the specimen with the seventh refocusing pulse 53 and receiving the B echo signal 17b, if any, but before irradiating the specimen with the eighth refocusing pulse 71, the value of "i", which has been incremented, is compared to the value of "n". "n" equals the number of times that the portion of the SLIME pulse sequence after the excitation pulse and the waiting time of $\tau_3$ is to be performed. If the value of "i" is not equal to "n", the portion of the SLIME pulse sequence 15d after the excitation pulse and the waiting time of $\tau_3$ is performed again, starting with the eighth refocusing pulse. When the value of "i" equals "n", the cumulative NQR signal is calculated by subtracting weighted sums of groups of B NQR signals from weighted sums of groups A NQR signals, as described above. The stored characteristics of NQR signals from a target substance are then compared with characteristics of the cumulative NQR signal, and then the presence or absence of the target substance, or an indeterminate result, is indicated, as discussed above.

Preferably, the amplitude of the transmitted RF pulses is substantially constant throughout the entire SLIME pulse sequence 15, 15a, 15b, 15c, 15d. Alternatively, the amplitude of any or all of the pulses, including subpulses, in any of the embodiments of the SLIME pulse sequence 15, 15a, 15b, 15c, 15d can be modulated, as long as the integrated area of each pulse that is amplitude modulated is substantially equal to or greater than the integrated area of the rectangular pulse that is replaced with the amplitude modulated pulse. Similarly, any rectangular pulse can be replaced with another rectangular pulse having a larger or smaller value of B. than the pulse being replaced, as long as the integrated area of the new pulse is substantially equal to the integrated area of the pulse being replaced.

Preferably, the frequency and the phase of the transmitted RF pulses are 15 substantially constant during each pulse throughout the SLIME pulse sequence 15, 15a, 15b, 15c, 15d. As discussed above, the frequency is chosen to be about equal to an expected NQR frequency of quadrupole nuclei in a target substance. Alternatively, frequency and/or phase modulated pulses may be substituted for any or all of the pulses, including subpulses, in any embodiment of the SLIME pulse sequence 15, 15a, 15b, 15c, 15d. For purposes of defining characteristics of the SLIME pulse sequence, frequency modulation and phase modulation are equivalent. Therefore, references herein to frequency modulation are defined to include both frequency modulation and phase modulation. "Modulation" is defined to encompass any type of change or variation during the pulse, and includes sweeping. Any of the pulses in the SLIME pulse sequence 15, 15a, 15b, 15c, 15d can be either frequency modulated or amplitude modulated, or both.

In some alternative embodiments, the frequency of the electromagnetic radiation in one, or some, or all of the pulses in the SLIME pulse sequence is modulated by sweeping the frequency over a range of frequencies. Sweeping the frequency increases the likelihood that some of the transmitted frequencies will be within the band of frequencies around the actual resonant frequency required to produce resonance in a quadrupolar nucleus whose NQR resonant frequency may be offset due to temperature or other effects.

In the frequency swept alternative embodiments, preferably each frequency swept pulse is required to conform to adiabatic conditions. The adiabatic condition is dependent upon the quadrupolar resonance characteristics of the specific chemical compound to be detected, and is defined as $1/T_2 << (1/B_1)(\partial\omega/\partial t) << |\gamma_n B_1|$, where $T_2$ is the spin-spin relaxation time, $B_1$ is the amplitude of the RF excitation magnetic field, $\gamma_n$ is the magnetogyric ratio, and $\partial\omega/\partial t$ is the rate of change of the excitation angular frequency per unit time. $\partial\omega/\partial t$ is a constant for a normal adiabatic fast passage pulse where the frequency changes linearly with time. Adiabatic pulses compensate for errors in the flip angles of nuclei, and produce nuclear spin manipulations that are less sensitive to magnetic field inhomogeneity and to frequency offset of the transmitted RF pulses from the actual NQR resonant frequency. Consequently, using adiabatic pulses increases the signal-to-noise ratio and the detection bandwidth, resulting in increased system sensitivity. The reduced sensitivity of adiabatic pulses to magnetic field inhomogeneity is particularly useful in polycrystalline samples.

Figure 9:
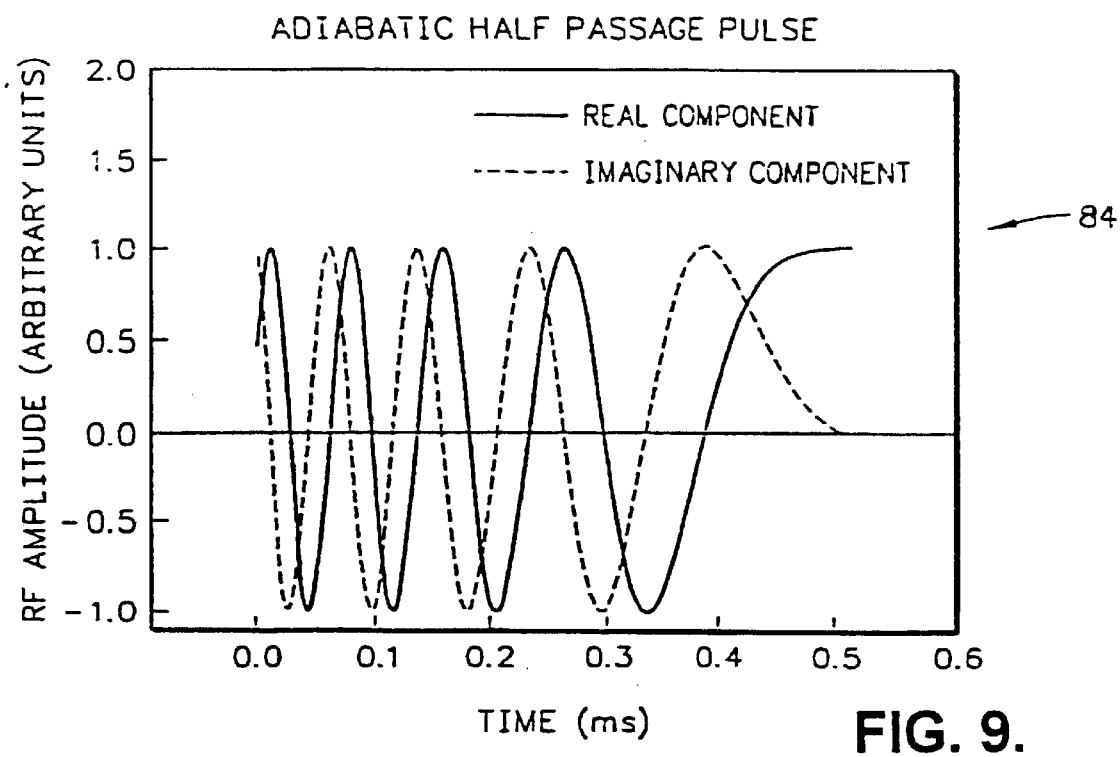
FIG. 9 is a diagram of a representative adiabatic half passage pulse for use in the SLIME pulse sequence.

In a first variation of the adiabatic frequency swept alternative embodiments, the frequency of at least one, and possibly all of the pulses in the SLIME pulse sequence is swept from a first frequency that is offset from an expected NQR resonance frequency of a target substance, to a second frequency that is about equal to the expected NQR resonance frequency of the target substance. In this alternative embodiment, preferably excitation pulse 26 (or 26a) is swept in this manner. Typically, the first frequency is offset from about one kHz to about twenty kHz, and preferably about three kHz, from the expected NQR resonant frequency. This type of pulse is referred to as an adiabatic half passage pulse. A representative adiabatic half passage pulse 84 is shown in FIG. 9.

Figure 10:
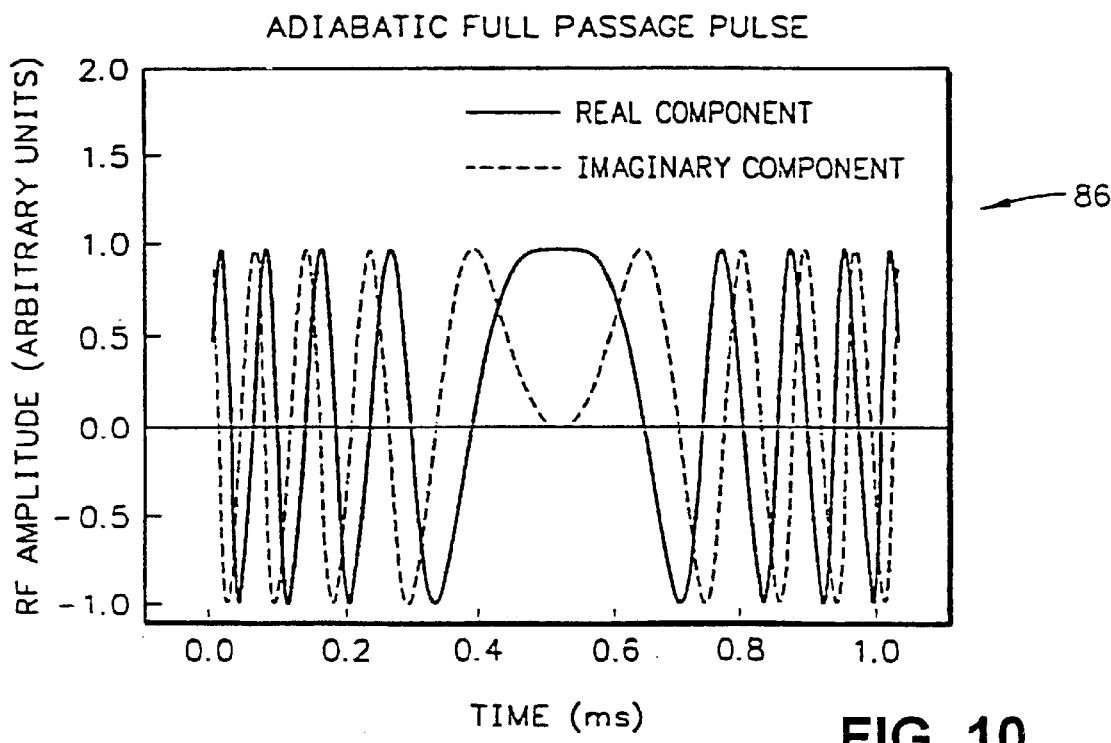
FIG. 10 is a diagram of a representative adiabatic full passage pulse for use in the SLIME pulse sequence.

In a second variation of the adiabatic frequency swept alternative embodiments, the frequency of at least one, and possibly all of the pulses in the SLIME pulse sequence is swept from a first frequency that is offset from an expected NQR resonance frequency of a target substance, to a second frequency about equal to the expected NQR resonance frequency of the target substance, and then to a third frequency that is offset in a direction opposite the first frequency from the expected NQR resonance frequency of the target substance. Typically, the first and third frequencies are offset from about one kHz to about twenty kHz, and preferably about three kHz, from the expected NQR resonant frequency. This second type of frequency swept pulse is referred to as an adiabatic full passage pulse. A representative adiabatic full passage pulse 86 is shown in FIG. 10. Both adiabatic half passage pulses and adiabatic full passage pulses may be referred to as adiabatic fast passage 141 pulses. In this alternative embodiment, referring to SLIME pulse sequence 15 in FIG. 2A, refocusing pulses 50, 51, 52, 53, 68, 69, 70, 71, and inverting pulses 72, 73, 74, 75 are preferably each adiabatic full passage pulses. Adiabatic pulses can also be similarly employed in the other embodiments of the SLIME pulse sequence 15a, 15b, 15c, 15d.

The frequency of both adiabatic half passage pulses and adiabatic full passage pulses can be swept in either direction, either from low to high or from high to low. The frequency of the frequency swept adiabatic pulses can be varied as an arbitrary function of time. For example, the frequency of the frequency swept adiabatic pulses can be varied as a linear, quadratic, higher polynomial, logarithmic or trigonometric function of time, to name a few of the numerous possibilities. In this alternative embodiment the frequency of the frequency swept adiabatic pulses is preferably varied as a linear function of time. If desired, different frequency swept adiabatic pulses in the SLIME pulse sequence can be varied with different functions of time.

In another alternative embodiment, the amplitude of at least one, and preferably all of the frequency swept pulses in the SLIME pulse sequence is also modulated. Preferably, the amplitude of the frequency swept pulses is slowly increased to a maximum value. These amplitude modulated pulses are also required to conform to adiabatic conditions. The amplitude of these adiabatic pulses can be varied as an arbitrary function of pulse duration, for example as a linear, quadratic, higher polynomial, logarithmic or trigonometric function of pulse duration, to name a few of the numerous possibilities. If desired, the amplitude of different amplitude modulated pulses in the SLIME pulse sequence can be varied with different functions of pulse duration.

Figure 11:
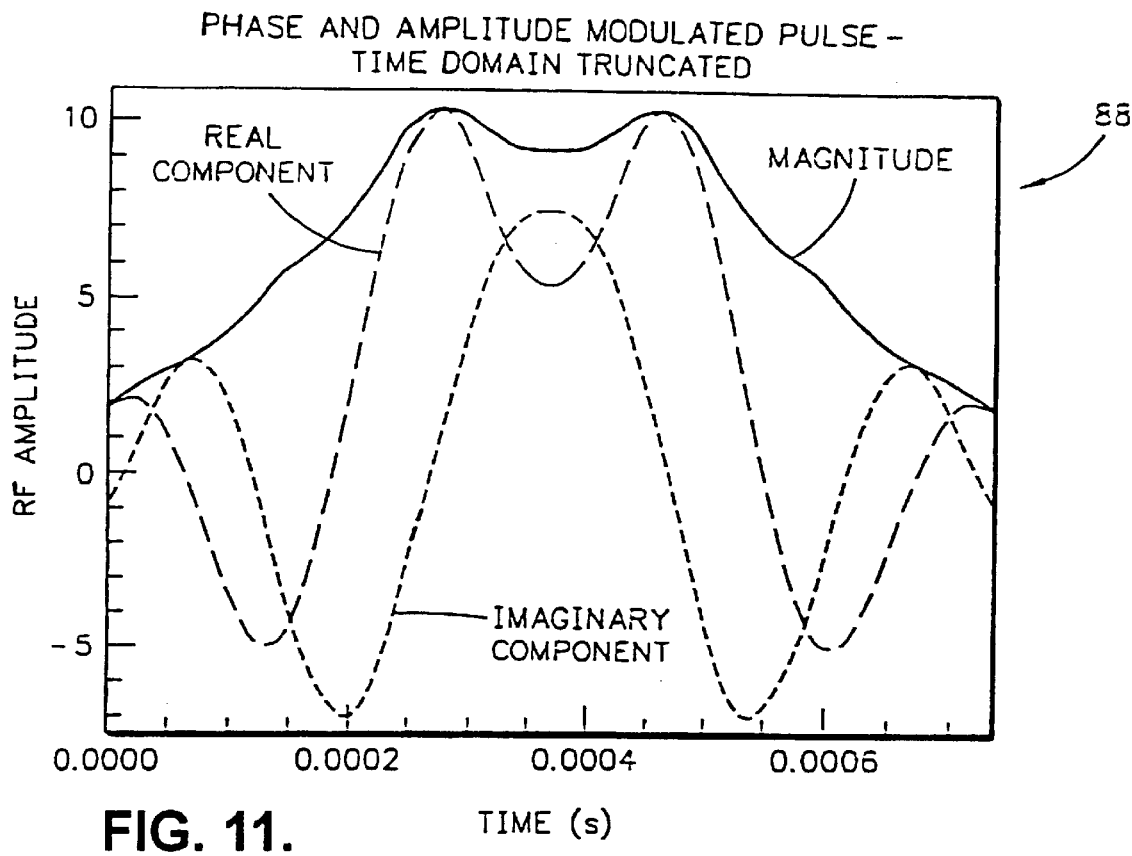
FIG. 11 is a diagram of a representative phase and amplitude modulated pulse for use in the SLIME pulse sequence.

In another alternative embodiment of the present invention, the frequency and amplitude of at least one, and preferably all, of the pulses in the SLIME pulse sequence 15, 15a, 15b, 15c, 15d are modulated to produce a substantially rectangular frequency response in the frequency domain generally centered around an NQR resonance frequency of a target substance. The desired time domain frequency and amplitude modulated waveform can be ascertained by obtaining the inverse Fourier transform of the desired frequency response in the frequency domain. These frequency swept and amplitude modulated pulses typically have a longer duration and excite a broader frequency spectrum than the non-frequency swept and non-amplitude modulated pulses that would be required to achieve the same flip angle of a quadrupolar nucleus. The frequency may be swept in an arbitrary manner. In this alternative embodiment the frequency is preferably swept linearly, which results in a longer pulse having a lower peak amplitude and having less energy outside the desired bandwidth than a pulse having constant frequency. A representative phase and amplitude modulated pulse 88, that has been truncated in the time domain, is shown in FIG. 11.

Figure 12:
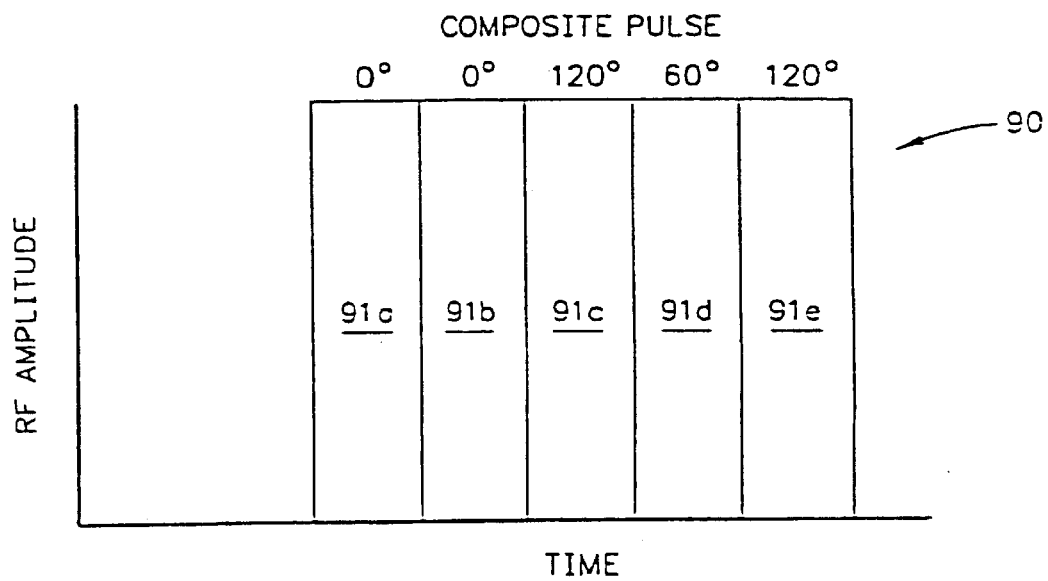
FIG. 12 is a diagram of a representative composite pulse for use in the SLIME pulse sequence.

In another alternative embodiment, at least one, and preferably all of the pulses in the SLIME pulse sequence 15, 15a, 15b, 15c, 15d include a plurality of segments. The phase of at least one segment differs from the phase of at least one other segment. This type of pulse is referred to as a composite pulse. The phase of a composite pulse is defined to be the phase of the first segment at the left end of the composite pulse. Accordingly, if the first segment of a composite pulse has phase X, $\overline{X}$, Y, or $\overline{Y}$, then the phase of the composite pulse is referred to respectively as X, $\overline{X}$, Y, or $\overline{Y}$. The segments of a composite pulse can have equal or unequal durations. A representative composite pulse 90 in which the segments 91a, 91b, 91c, 91d, and 91c have equal durations is illustrated in FIG. 12. The segments of a composite pulse can have any phases that together will produce the desired spin manipulation. In the composite pulse 90 illustrated in FIG. 12, the phase of each segment relative to the first segment 91a of the pulse is designated 0 (zero) degrees, 120 (one hundred twenty) degrees, or 60 (sixty) degrees. Optionally, the amplitude of a composite pulse could be modulated. Composite pulses have benefits similar to the benefits of adiabatic pulses discussed above.

Figure 13A:
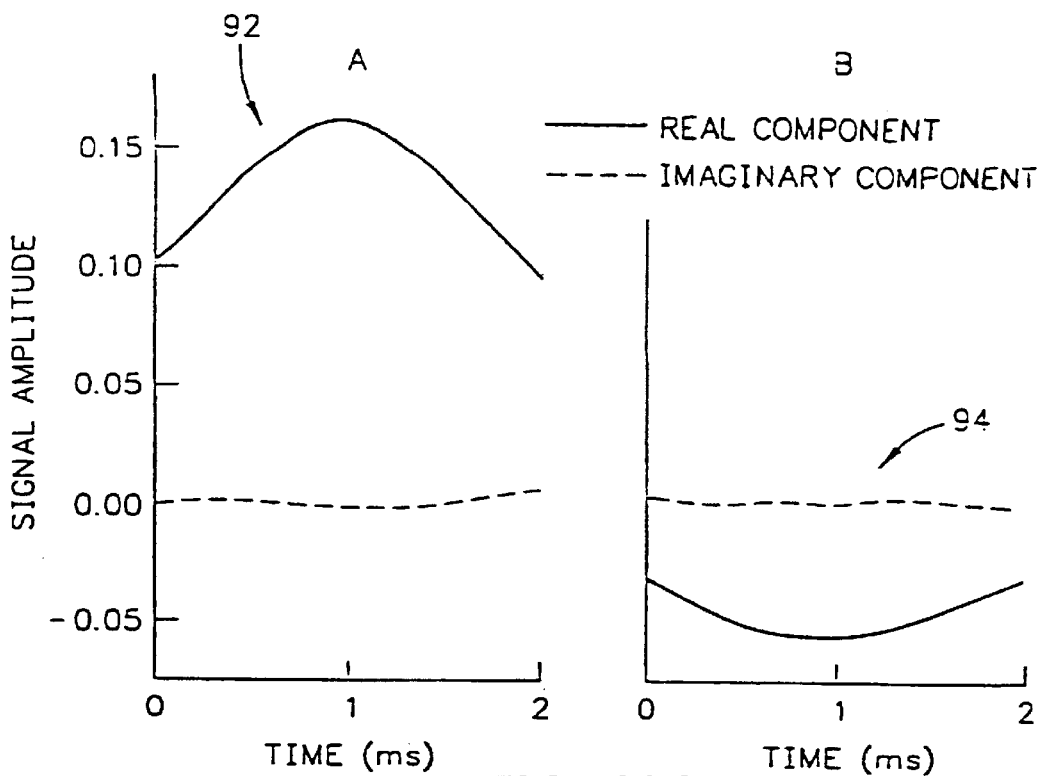
FIG. 13A is a graph showing averages of oppositely-phased NQR echo signals received during the SLIME pulse sequence for a resonant frequency of $^{14}N$ in $NaNO_2$, under specific conditions.
Figure 13B:
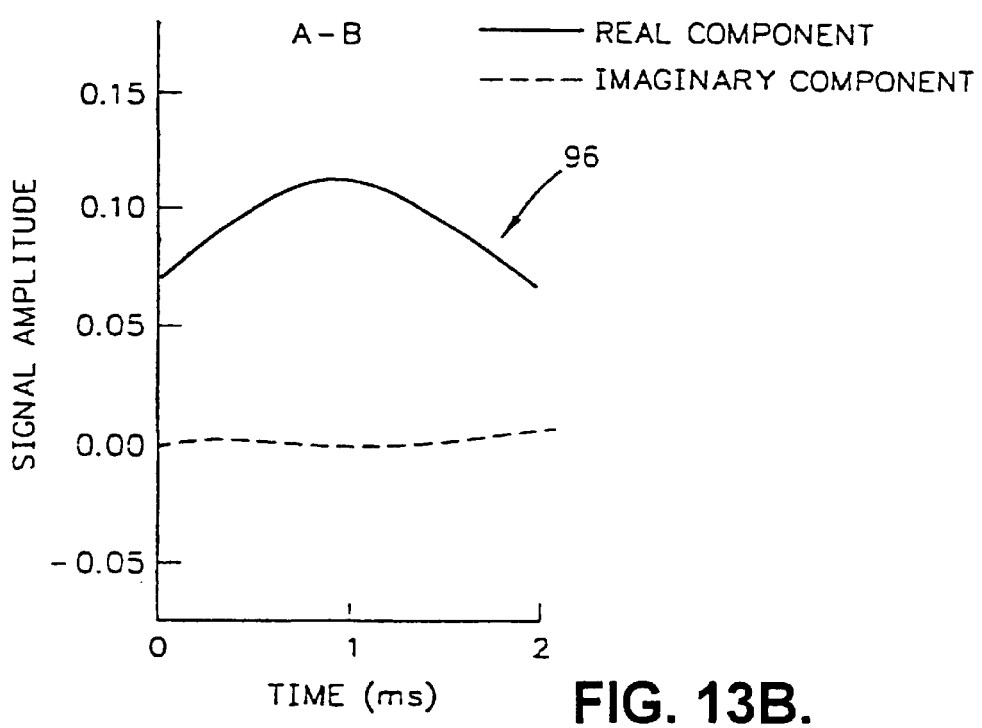
FIG. 13B is a graph showing the NQR echo signal obtained by subtracting the B average NQR echo signal of FIG. 13A from the A average NQR echo signal of FIG. 13A.

FIG. 13A shows the average of actual A NQR echo signals 92 and the average of actual B NQR echo signals 94 obtained by performing the first embodiment of the SLIME pulse sequence 15 illustrated in FIG. 2A up to the point indicated by line 85c, one time. These signals were obtained at room temperature for the $\nu_0$ resonance frequency of $^{14}$N in NaNO$_2$ (sodium nitrite), under the following conditions: $\tau$ equals one (1) millisecond, $\tau_1$ equals one (1) millisecond, $\tau_2$ equals one (1) millisecond, $\tau_3$ equals one (1) millisecond, $\tau_{ex}$ equals three hundred (300) microseconds, $\tau_{ref}$ equals three hundred sixty (360) microseconds, $\tau_{inv}$ equals three hundred (300) microseconds, and m equals twenty (20), with rectangular, constant frequency pulses. For both NaNO$_2$ and PETN, the ratio of $T_1/T_2$ is >>five (5), and $T_1$ is >>one (1) second. Accordingly, for purposes of illustrating the effectiveness of the SLIME pulse sequence, the NQR response of $^{14}$N in NaNO$_2$ is representative of the NQR response of $^{14}$N in PETN. Signal 92 is the average of the twenty (20) A NQR echo signals 16a received, and signal 94 is the average of the twenty (20) B NQR echo signals 17a received, with no signal weighting. FIG. 13B shows a signal 96 that is the result of subtracting the B average signal 94 from the A average signal 92, and dividing the result by two (2) to scale the result to fit on the graph. The signal 96 shown in FIG. 13B generally corresponds with the representative cumulative echo signal 19 sketched in FIG. 2B.

Figure 14A:
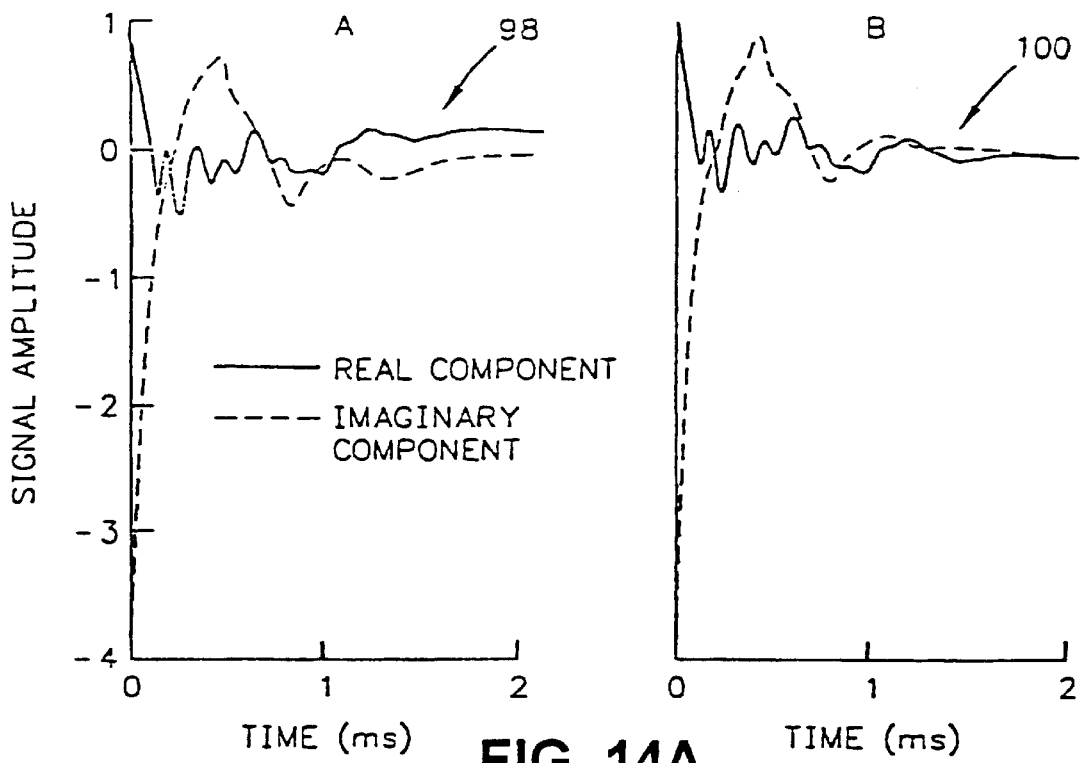
FIG. 14A is a graph showing averages of oppositely-phased NQR echo signals for $^{14}N$ in $NaNO_2$ and contemporaneous magneto-acoustic ringing signals received during the SLIME pulse sequence under conditions identical to those in FIG. 13A, except that in addition to the $NaNO_2$, an object that produces magneto-acoustic ringing was also irradiated with the RF pulses to generate large magneto-acoustic ringing signals.
Figure 14B:
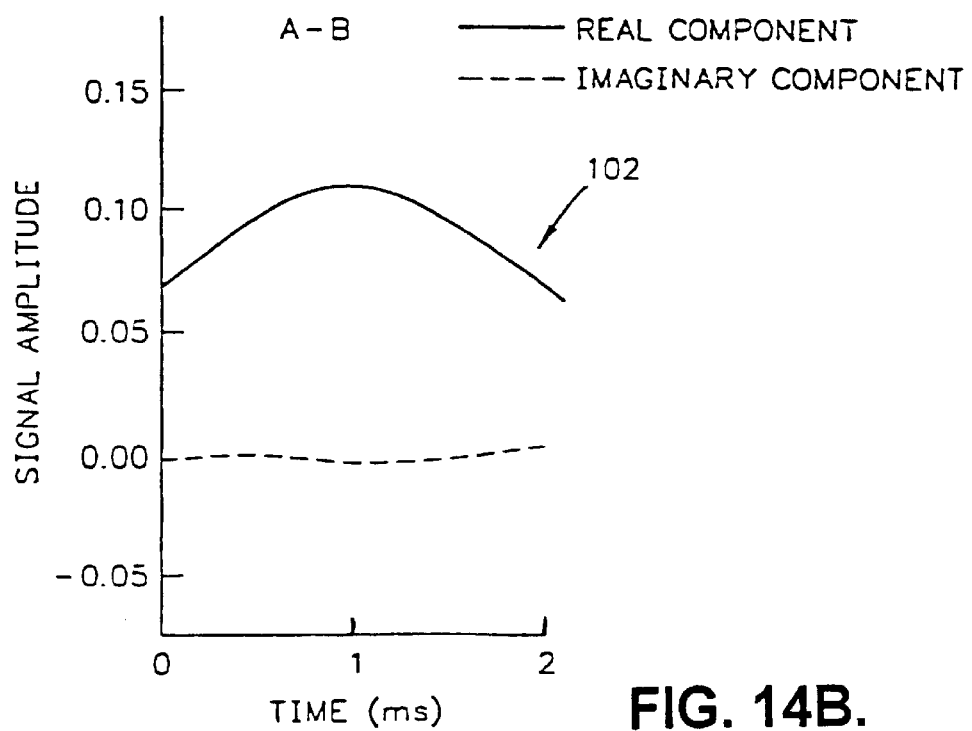
FIG. 14B is a graph showing the NQR echo signal obtained by subtracting the B average NQR echo signal and contemporaneous magneto-acoustic ringing signal of FIG. 14A from the A average NQR echo signal and contemporaneous magneto-acoustic ringing signal of FIG. 14A, illustrating the cancellation of the magneto-acoustic ringing signals.

FIG. 14A shows the average of actual A NQR echo signals and contemporaneous extraneous signals 98 and the average of actual B NQR echo signals and contemporaneous extraneous signals 100, for $^{14}$N in NaNO$_2$ using the same pulse sequence as FIG. 13A under conditions identical to those in FIG. 13A, except that an object that produces magneto-acoustic ringing was irradiated with the RF waves along with the NaNO$_2$. The object was included in order to produce very large extraneous signals from magneto-acoustic ringing. Signal 98 is the average of the twenty (20) A NQR echo signals and contemporaneous extraneous signals 16a received, and signal 100 is the average of the twenty (20) B NQR echo signals and contemporaneous extraneous signals 17a received, with no signal weighting. FIG. 14B shows a signal 102 that is the result of subtracting the B average signal 100 from the A average signal 98, and scaling the result to fit on the graph. As a result of the subtraction, the magneto-acoustic ringing shown in FIG. 14A is not present in signal 102 in FIG. 14B. The signal 102 shown in FIG. 14B generally corresponds with the representative cumulative echo signal 19 sketched in FIG. 2B. Actual A and B echo signals corresponding with A and B echo signals 16a, 16b, 17a, and 17b produced using the other embodiments of the SLIME pulse sequence illustrated in FIGS. 2A, 5, 6A, and 7 would be substantially identical to the signals 92, 94, 98 and 100 in FIGS. 13A and 14A, and the resulting cumulative echo signals would be substantially identical to the signals 96 and 102 shown in FIGS. 13B and 14B, if produced under the same conditions. FIG. 14B illustrates the effectiveness of the SLIME pulse sequence for producing signals that can be used to eliminate magneto-acoustic ringing.

In view of the above description it is likely that modifications and improvements will occur to those skilled in this technical field which are within the scope of this invention. Accordingly, this invention is to be limited only by the spirit and scope of the appended claims.

What is claimed is:

1. A method for producing improved NQR signals by canceling extraneous signals in an NQR detection system for detecting the presence of a target substance in a specimen, the target substance having quadrupolar nuclei, the nuclei having an NQR resonant frequency, the method comprising:

irradiating the specimen with at least one scan of a sequence of electromagnetic pulses having only a single excitation pulse, the pulse sequence being a spin-locked inversion mid-echo (SLIME) pulse sequence, the frequency of the pulses in the irradiating pulse sequence generally corresponding to the NQR resonant frequency of the target substance, the parameters of the pulses and pulse sequence being functionally effective to excite from the target substance at least one A NQR signal with any contemporaneous extraneous signals, and at least one B NQR signal with any contemporaneous extraneous signals, the phase of each A NQR signal being about opposite to the phase of each B NQR signal and with the phase of the respective extraneous signals being about the same during each A and B NQR signal;

at least once, detecting an A NQR signal and a B NQR signal; and subtracting said B NQR signals and contemporaneous extraneous signals from said A NQR signals and contemporaneous extraneous signals, thereby producing a cumulative NQR signal and canceling out the extraneous signals.

2. The method recited in claim 1, wherein the subtracting act comprises dividing a plurality of the A NQR signals and contemporaneous extraneous signals into groups, dividing a plurality of the B NQR signals and contemporaneous extraneous signals into groups, calculating the sum of each group, weighting each sum, and calculating the sum of the weighted sums of A NQR signals and contemporaneous extraneous signals and the negative of the weighted sums of B NQR signals and contemporaneous extraneous signals.

3. The method recited in claim 1, wherein the extraneous signals are selected from the group consisting of magneto-acoustic ringing, piezo-electric ringing, and electronic circuit ringing.

4. The method recited in claim 1, wherein the extraneous signals comprise baseline offset.

5. The method recited in claim 1, wherein the A and B NQR signals are echo signals.

6. The method recited in claim 1, wherein the target substance to be detected has a nucleus selected from the group consisting of $^{14}$N, $^{35}$C, $^{37}$Cl, $^{23}$Na and $^{39}$K.

7. The method recited in claim 1, wherein the frequency of each pulse is about constant and is about the same as the frequency of each other pulse.

8. The method recited in claim 1, wherein the amplitude of at least one of the pulses is modulated.

9. The method recited in claim 1, wherein the frequency of at least one of the pulses is modulated.

10. The method recited in claim 9, wherein the amplitude of at least one of the frequency modulated pulses is modulated, and wherein each amplitude and frequency modulated pulse conforms to adiabatic conditions.

11. The method recited in claim 1, wherein the frequency of at least one of the pulses is swept from a first frequency to a second frequency, with the second frequency being about equal to an NQR resonant frequency of the target substance, and wherein each frequency swept pulse conforms to adiabatic conditions.

12. The method recited in claim 1, wherein the frequency of at least one of the pulses is swept from a first frequency, to a second frequency about equal to an NQR resonant frequency of a target substance, to a third frequency, and wherein each frequency swept pulse conforms to adiabatic conditions.

13. The method recited in claim 1, wherein the frequency and amplitude of at least one of the pulses are modulated to produce a substantially rectangular frequency response in the frequency domain about centered around an NQR resonant frequency of a target substance.

14. The method recited in claim 1, wherein at least one of the pulses comprises a plurality of segments, and wherein the phase of at least one segment differs from the phase of at least one other segment.

15. In an NQR detection system for detecting the presence of a target substance in a specimen, the target substance having a quadrupolar nuclei, the nuclei having an NQR resonant frequency, there normally being extraneous signals with the detected NQR response signals, a method for canceling the extraneous signals comprising:

irradiating the specimen with a single scan of a sequence of electromagnetic pulses, the sequence having only a single excitation pulse, the pulse sequence being a spin-locked inversion mid-echo (SLIME) pulse sequence, the frequency of the pulses in the irradiating pulse sequence generally corresponding to the NQR resonant frequency of the target substance, the parameters of the pulses and pulse sequence being functionally effective to excite from the target substance at least one A NQR signal with any contemporaneous extraneous signals and at least one B NQR signal with any contemporaneous extraneous signals, the phase of each A NQR signal being about opposite to the phase of each B NQR signal and with the phase of the respective extraneous signals being about the same during each A and B NQR signal;

at least once, detecting an A NQR signal and a B NQR signal; and subtracting said B NQR signals and contemporaneous extraneous signals from said A NQR signals and contemporaneous extraneous signals, thereby producing a cumulative NQR signal and canceling out the extraneous signals.

16. A method for producing oppositely phased NQR echo signals in an NQR detection system for detecting the presence of a target substance in a specimen, the target substance having a quadrupolar nuclei, the nuclei having an NQR resonant frequency, the method comprising:

employing a spin-locked inversion mid-echo (SLIME) pulse sequence:
 (a) irradiating the specimen with an excitation pulse of said pulse sequence having a phase of about X;
 (b) at least once, irradiating the specimen with a first refocusing pulse of said pulse sequence having a phase of about Y, and then;
 (c) receiving an A echo signal transmitted from the specimen, if any;
 (d) irradiating the specimen with a second refocusing pulse of said pulse sequence having a phase of about Y;
 (e) irradiating the specimen with a first inverting pulse of said pulse sequence having a phase selected from the group consisting of about X and about $\overline{X}$;
 (f) at least once, irradiating the specimen with a third refocusing pulse of said pulse sequence having a phase of about Y, and then;
 (g) receiving a B echo signal transmitted from the specimen, if any.

17. A method for producing improved echo signals by canceling extraneous signals in an NQR detection system for detecting the presence of a target substance in a specimen, the target substance having quadrupolar nuclei, the nuclei having an NQR resonant frequency, the method comprising:

employing a spin-locked inversion mid-echo (SLIME) pulse sequence:
 (a) irradiating the specimen with only a single excitation pulse of said pulse sequence having a phase of about X;
 (b) at least once irradiating the specimen with a first refocusing pulse of said pulse sequence having a phase of about Y, and then;
 (c) receiving an A echo signal transmitted from the specimen, together with any contemporaneous extraneous signals;
 (d) irradiating the specimen with a second refocusing pulse of the pulse sequence having a phase of about Y;
 (e) irradiating the specimen with a first inverting pulse of said pulse sequence having a phase selected from the group consisting of about X and about $\overline{X}$;
 (f) at least once irradiating the specimen with a third refocusing pulse of said pulse sequence having a phase of about Y, and then;
 (g) receiving a B echo signal transmitted from the specimen, together with any contemporaneous signals; and
 (h) subtracting one or more B echo signals and contemporaneous extraneous signals from one or more A echo signals and contemporaneous extraneous signals to produce a cumulative echo signal and to cancel out the extraneous signals.

18. The method recited in claim 17, and comprising prior to act (b) the further act of, at least once, irradiating the specimen with a first refocusing pulse having a phase of about Y.

19. The method recited in claim 17, and comprising prior to act (f) the further act of, at least once, irradiating the specimen with a third refocusing pulse having a phase of about Y.

20. The method recited in claim 17, wherein the first inverting pulse has a phase of about X.

21. The method recited in claim 17, wherein the first inverting pulse has a phase of about $\overline{X}$.

22. The method recited in claim 17, wherein act (h) comprises dividing a plurality of the A echo signals and contemporaneous extraneous signals into groups, dividing a plurality of the B echo signals and contemporaneous extraneous signals into groups, calculating the sum of each group, weighting each sum, and calculating the sum of the weighted sums of A echo signals and contemporaneous extraneous signals and the negative of the weighted sums of B echo signals and contemporaneous extraneous signals.

23. The method recited in claim 17, wherein act (b) is performed between about one and about ten thousand times, and act (f) is performed between about one and about ten thousand times.

24. The method recited in claim 17, wherein act (b) and act (f) are each performed m times, wherein m is between about one and about ten thousand.

25. The method recited in claim 17, wherein act (b) is performed m times, and wherein m is about 102.

26. The method recited in claim 17, wherein act (f) is performed m times, and wherein m is about 102.

27. The method recited in claim 17, wherein at least one of the pulses is subdivided into a corresponding set of at least two subpulses, and wherein the sum of the integrated areas of the subpulses in each respective set of subpulses is about equal to the integrated area of the corresponding pulse.

28. The method recited in claim 17, wherein the extraneous signals are selected from the group consisting of magneto-acoustic ringing, piezo-electric ringing, and electronic circuit ringing.

29. The method recited in claim 17, wherein the extraneous signals comprise baseline offset.

30. The method recited in claim 17, wherein the target substance is selected from the group consisting of explosives and drugs.

31. The method recited in claim 17, wherein the target substance to be detected has a nucleus selected from the group consisting of $^{14}$N, $^{35}$Cl, $^{37}$Cl, $^{23}$Na and $^{39}$K.

32. The method recited in claim 17, wherein the frequency of the pulses is near a $^{14}$N NQR frequency in the target substance to be detected.

33. The method recited in claim 17, wherein the amplitude of at least one of the pulses is modulated.

34. The method recited in claim 17, wherein the frequency of at least one of the pulses is modulated.

35. The method recited in claim 34, wherein the amplitude of at least one of the frequency modulated pulses is modulated, and wherein each amplitude and frequency modulated pulse conforms to adiabatic conditions.

36. The method recited in claim 17, wherein the frequency of at least one of the pulses is swept from a first frequency to a second frequency, with the second frequency being about equal to an NQR resonant frequency of the target substance, and wherein each frequency swept pulse conforms to adiabatic conditions.

37. The method recited in claim 17, wherein the frequency of at least one of the pulses is swept from a first frequency, to a second frequency about equal to an NQR resonant frequency of a target substance, to a third frequency, and wherein each frequency swept pulse conforms to adiabatic conditions.

38. The method recited in claim 17, wherein the frequency and amplitude of at least one of the pulses are modulated to produce a substantially rectangular frequency response in the frequency domain about centered around an NQR resonant frequency of a target substance.

39. The method recited in claim 17, wherein at least one of the pulses comprises a plurality of segments, and wherein the phase of at least one segment differs from the phase of at least one other segment.

40. The method recited in claim 17, and comprising prior to act (h) the further acts of:
  (i) at least once, irradiating the specimen with a fourth refocusing pulse of said pulse sequence having a phase of about Y, and then;
  (j) receiving a B echo signal transmitted from the specimen;
  (k) irradiating the specimen with a fifth refocusing pulse of said pulse sequence having a phase of about Y;
  (l) irradiating the specimen with a second inverting pulse of said pulse sequence having a phase selected from the group consisting of about X and about $\overline{X}$;
  (m) at least once, irradiating the specimen with a sixth refocusing pulse of said pulse sequence having a phase of about Y, and then;
  (n) receiving an A echo signal transmitted from the specimen.

41. The method recited in claim 40, and comprising prior to act (h) the further act of, at least once:
  (o) repeating acts (b) through (g) and (i) through (n).

42. The method recited in claim 17, and comprising prior to act (h) the further acts of:
  (i) irradiating the specimen with a fourth refocusing pulse of said pulse sequence having a phase of about Y;
  (j) irradiating the specimen with a second inverting pulse of said pulse sequence having a phase selected from the group consisting of about X and about $\overline{X}$;
  (k) at least once irradiating the specimen with a fifth refocusing pulse of said pulse sequence having a phase of about Y, and then;
  (l) receiving an A echo signal transmitted from the specimen;
  (m) irradiating the specimen with a sixth refocusing pulse of said pulse sequence having a phase of about Y;
  (n) irradiating the specimen with a third inverting pulse of said pulse sequence having a phase selected from the group consisting of about X and about $\overline{X}$;
  (o) at least once irradiating the specimen with a seventh refocusing pulse of said pulse sequence having a phase of about Y, and then;
  (p) receiving a B echo signal transmitted from the specimen.

43. The method recited in claim 42, wherein the first inverting pulse has a phase selected from the group consisting of about X and about $\overline{X}$, the second inverting pulse has a phase selected from the group consisting of about X and about $\overline{X}$, and the third inverting pulse has a phase selected from the group consisting of about X and about $\overline{X}$.

44. The method recited in claim 42, wherein act (b) is performed between about one and about ten thousand times, acts (f) and (g) are performed between about one and about ten thousand times, acts (k) and (l) are performed between about one and about ten thousand times, and acts (o) and (p) are performed between about one and about ten thousand times.

45. The method recited in claim 42, wherein act (b) is performed m times, and wherein m is about 102.

46. The method recited in claim 42, wherein acts (f) and (g) are performed m times, and wherein m is about 102.

47. The method recited in claim 42, wherein acts (k) and (l) are performed m times, and wherein m is about 102.

48. The method recited in claim 42, wherein acts (o) and (p) are performed m times, and wherein m is about 102.

49. The method recited in claim 17, wherein at least one of the pulses is subdivided into a corresponding set of at least two subpulses, and wherein the sum of the integrated areas of the subpulses in each respective set of subpulses is about equal to the integrated area of the corresponding pulse.

50. The method recited in claim 42, and comprising prior to act (h) the further acts of, at least once:
  (q) irradiating the specimen with an eighth refocusing pulse of said pulse sequence having a phase of about Y;
  (r) irradiating the specimen with a fourth inverting pulse of said pulse sequence having a phase selected from the group consisting of about X and about $\overline{X}$; and
  (s) repeating acts (b) through (g) and (i) through (p).

51. The method recited in claim 50, wherein the phase of the first and second inverting pulses is about $\overline{X}$, and the phase of the third and fourth inverting pulses is about X.

52. The method recited in claim 50, wherein the phase of the first and fourth inverting pulses is about $\overline{X}$, and the phase of the second and third inverting pulses is about X.

53. The method recited in claim 50, wherein the sequence of acts (q) through (s) is executed n−1 times, wherein n is between about one and about one hundred thousand.

54. The method recited in claim 53, wherein n is about 8.

55. The method recited in claim 42, and comprising in the following order the further acts of:
  (q) waiting, after the seventh refocusing pulse, a time of at least about 0.5 the $T_1$ time of a quadrupolar nucleus to be excited in the target substance;
  (r) irradiating the specimen with an excitation pulse of said pulse sequence having a phase of about $\overline{X}$;
  (s) at least once irradiating the specimen with a first refocusing pulse of said pulse sequence having a phase of about Y, and then;
  (t) receiving a B echo signal transmitted from the specimen;
  (u) irradiating the specimen with a second refocusing pulse of said pulse sequence having a phase of about Y;
  (v) irradiating the specimen with a first inverting pulse of said pulse sequence having a phase selected from the group consisting of about X and about $\overline{X}$;
  (w) at least once irradiating the specimen with a third refocusing pulse of said pulse sequence having a phase of about Y, and then;
  (x) receiving an A echo signal transmitted from the specimen;
  (y) irradiating the specimen with a fourth refocusing pulse of said pulse sequence having a phase of about Y;

(z) irradiating the specimen with a second inverting pulse of said pulse sequence having a phase selected from the group consisting of about X and about $\overline{X}$;

(aa) at least once irradiating the specimen with a fifth refocusing pulse of said pulse sequence having a phase of about Y, and then;

(ab) receiving a B echo signal transmitted from the specimen;

(ac) irradiating the specimen with a sixth refocusing pulse of said pulse sequence having a phase of about Y;

(ad) irradiating the specimen with a third inverting pulse of said pulse sequence having a phase selected from the group consisting of about X and about $\overline{X}$;

(ae) at least once irradiating the specimen with a seventh refocusing pulse of said pulse sequence having a phase of about Y, and then;

(af) receiving an A echo signal transmitted from the specimen.

56. A method for producing oppositely phased NQR echo signals in an NQR detection system for detecting the presence of a target substance in a specimen, the target substance having quadrupolar nuclei, the nuclei having an NQR resonant frequency, the method comprising:

employing a spin-locked inversion mid-echo (SLIME) pulse sequence:

(a) irradiating the specimen with only a single excitation pulse of said pulse sequence having a phase of about X, and a duration of about $\tau_{ex}$, and then;

(b) waiting a time of about $\tau_3$;

(c) at least once irradiating the specimen with a first refocusing pulse of said pulse sequence having a phase of about Y, and duration of about $\tau_{ref}$;

(d) irradiating the specimen with a second refocusing pulse of said pulse sequence having a phase of about Y, and a duration of about $\tau_{ref}$, and then;

(e) waiting a time of about $\tau_1$;

(f) irradiating the specimen with a first inverting pulse of said pulse sequence having a phase selected from the group consisting of about X and about $\overline{X}$, and having a duration of about $2\tau_{inv}$, and then;

(g) waiting a time of about $\tau_1$; and (h) at least once irradiating the specimen with a third refocusing pulse of said pulse sequence having a phase of about Y, and a duration of about $\tau_{ref}$.

57. A method for canceling extraneous signals in an NQR detection system for detecting the presence of a target substance in a specimen, the target substance having quadrupolar nuclei, the nuclei having an NQR resonant frequency, the method comprising:

employing a spin-locked inversion mid-echo (SLIME) pulse sequence:

(a) irradiating the specimen with only a single excitation pulse of said pulse sequence having a phase of about X, and a duration of about $\tau_{ex}$, and then;

(b) waiting a time of about $\tau_3$;

(c) at least once irradiating the specimen with a first refocusing pulse of said pulse sequence having a phase of about Y, and duration of about $\tau_{ref}$, and then;

(d) receiving during a time of about $2\tau$ an A echo signal and any contemporaneous extraneous signals transmitted from the specimen;

(e) irradiating the specimen with a second refocusing pulse of said pulse sequence having a phase of about Y, and a duration of about $\tau_{ref}$, and then;

(f) waiting a time of about $\tau_1$;

(g) irradiating the specimen with a first inverting pulse of said pulse sequence having a phase selected from the group consisting of about X and about $\overline{X}$, and having a duration of about $2\tau_{inv}$, and then;

(h) waiting a time of about $\tau_1$;

(i) at least once irradiating the specimen with a third refocusing pulse of said pulse sequence having a phase of about Y, and a duration of about $\tau_{ref}$, and then;

(j) receiving during a time of about $2\tau$ a B echo signal and any contemporaneous extraneous signals transmitted from the specimen; and (k) subtracting one or more B echo signals and contemporaneous extraneous signals from one or more A echo signals and contemporaneous extraneous signals to produce a cumulative echo signal and to cancel out the extraneous signals.

58. The method recited in claim 57, and comprising prior to act (c) the further act of, at least once, irradiating the specimen with a first refocusing pulse having a phase of about Y, and duration of about $\tau_{ref}$.

59. The method recited in claim 57, and comprising prior to act (h) the further act of, at least once, irradiating the specimen with a third refocusing pulse having a phase of about Y, and duration of about $\tau_{ref}$.

60. The method recited in claim 57, wherein the first inverting pulse is selected from the group consisting of about X and about $\overline{X}$.

61. The method recited in claim 57, wherein act (c) is performed between about one and about ten thousand times, and acts (i) and (j) are performed between about one and about ten thousand times.

62. The method recited in claim 57, wherein act (c) and acts (i) and (j) are each performed m times, wherein m is between about one and about ten thousand.

63. The method recited in claim 57, wherein act (c) is performed ni times, and wherein m is about 102.

64. The method recited in claim 57, wherein acts (e) and (f) are performed m times, and wherein m is about 102.

65. The method recited in claim 57, wherein at least one of the pulses is subdivided into a corresponding set of at least two subpulses, and wherein the sum of the integrated areas of the subpulses in each respective set of subpulses is about equal to the integrated area of the corresponding pulse.

66. The method recited in claim 57, wherein the amplitude of at least one of the pulses is modulated.

67. The method recited in claim 57, wherein the frequency of at least one of the pulses is modulated.

68. The method recited in claim 57, wherein the target substance to be detected has a nucleus selected from the group consisting of $^{14}N$, $^{35}Cl$, $^{37}Cl$, $^{23}Na$ and $^{39}K$.

69. The method recited in claim 57, wherein $\tau_{ex}$ is between about one microsecond and about ten milliseconds.

70. The method recited in claim 57, wherein $\tau_{ref}$ is between about one microsecond and about ten milliseconds.

71. The method recited in claim 57, wherein $\tau_{inv}$ is between about one microsecond and about ten milliseconds.

72. The method recited in claim 57, wherein $\tau$ is between about one microsecond and about one hundred milliseconds.

73. The method recited in claim 57, wherein $\tau_1$ is between about zero microseconds and about one hundred milliseconds.

74. The method recited in claim 57, wherein $\tau_3$ is between about one microsecond and about one hundred milliseconds.

75. The method recited in claim 57, wherein $\tau_1$ is about equal to $\tau$.

76. The method recited in claim 57, wherein $\tau_3$ is about equal to $\tau$.

77. The method recited in claim 57, wherein $\tau_{inv}$ is about equal to $\tau_{ex}$.

78. The method recited in claim 57, wherein $\tau_{ref}$ is about equal to $1.25\tau_{ex}$.

79. The method recited in claim 57, and comprising prior to act (k) the further acts of:
- (l) at least once irradiating the specimen with a fourth refocusing pulse of said pulse sequence having a phase of about Y, and duration of about $\tau_{ref}$, and then;
- (m) receiving during a time of about $2\tau$ a B echo signal transmitted from the specimen;
- (n) irradiating the specimen with a fifth refocusing pulse of said pulse sequence having a phase of about Y, and a duration of about $\tau_{ref}$, and then;
- (o) waiting a time of about $\tau_1$;
- (p) irradiating the specimen with a second inverting pulse of said pulse sequence having a phase selected from the group consisting of about X and about $\overline{X}$, and having a duration of about $2\tau_{inv}$, and then;
- (q) waiting a time of about $\tau_1$;
- (r) at least once irradiating the specimen with a sixth refocusing pulse of said pulse sequence having a phase of about Y, and duration of about $\tau_{ref}$, and then;
- (s) receiving during a time of about $2\tau$ an A echo signal transmitted from the specimen.

80. The method recited in claim 79, and comprising prior to act (k) the further acts of, at least once:
- (t) repeating acts (c) through (j) and (l) through (s).

81. The method recited in claim 57, and comprising prior to act (k) the further acts of:
- (l) irradiating the specimen with a fourth refocusing pulse of said pulse sequence having a phase of about Y, and a duration of about $\tau_{ref}$, and then;
- (m) waiting a time of about $\tau_1$;
- (n) irradiating the specimen with a second inverting pulse of said pulse sequence having a phase selected from the group consisting of about X and about $\overline{X}$, and having a duration of about $2\tau_{inv}$, and then;
- (o) waiting a time of about $\tau_1$;
- (p) at least once irradiating the specimen with a fifth refocusing pulse of said pulse sequence having a phase of about Y, and duration of about $\tau_{ref}$, and then;
- (q) receiving during a time of about $2\tau$ an A echo signal transmitted from the specimen;
- (r) irradiating the specimen with a sixth refocusing pulse of said pulse sequence having a phase of about Y, and a duration of about $\tau_{ref}$, and then;
- (s) waiting a time of about $\tau_1$;
- (t) irradiating the specimen with a third inverting pulse of said pulse sequence having a phase selected from the group consisting of about X and about $\overline{X}$, and having a duration of about $2\tau_{inv}$, and then;
- (u) waiting a time of about $\tau_1$;
- (v) at least once, irradiating the specimen with a seventh refocusing pulse of said pulse sequence having a phase of about Y, and a duration of about $\tau_{ref}$, and then;
- (w) receiving during a time of about $2\tau$ a B echo signal transmitted from the specimen.

82. The method recited in claim 81, wherein the first inverting pulse has a phase selected from the group consisting of about X and about $\overline{X}$, the second inverting pulse has a phase selected from the group consisting of about X and about $\overline{X}$, and the third inverting pulse has a phase selected from the group consisting of about X and about $\overline{X}$.

83. The method recited in claim 81, wherein acts (c) and (d) are performed between about one and about ten thousand times, acts (i) and (j) are performed between about one and about ten thousand times, acts (p) and (q) are performed between about one and about ten thousand times, and acts (v) and (w) are performed between about one and about ten thousand times.

84. The method recited in claim 81, wherein at least one of the pulses is subdivided into a corresponding set of at least two subpulses, and wherein the sum of the integrated areas of the subpulses in each respective set of subpulses is about equal to the integrated area of the corresponding pulse.

85. The method recited in claim 81, and comprising prior to act (k) the further acts of, at least once:
- (x) irradiating the specimen with an eighth refocusing pulse of said pulse sequence having a phase of about Y, and a duration of about $\tau_{ref}$, and then;
- (y) waiting a time of about $\tau_1$;
- (z) irradiating the specimen with a fourth inverting pulse of said pulse sequence having a phase selected from the group consisting of about X and about $\overline{X}$, and having a duration of about $2\tau_{inv}$, and then;
- (aa) waiting a time of about $\tau_1$; and
- (ab) repeating acts (c) through (f) and (l) through (w).

86. The method recited in claim 85, wherein the sequence of acts (x) through (ab) is executed n–1 times, wherein n is between about one and about one hundred thousand.

87. The method recited in claim 86, wherein n is about 8.

88. The method recited in claim 85, wherein the first inverting pulse is subdivided into an A-first inverting subpulse and a B-first inverting subpulse with the sum of the durations of the A-first inverting subpulse and the B-first inverting subpulse being about $2\tau_{inv}$, and wherein the second inverting pulse is subdivided into an A-second inverting subpulse and a B-second inverting subpulse with the sum of the durations of the A-second inverting subpulse and the B-second inverting subpulse being about $2\tau_{inv}$, and wherein the third inverting pulse is subdivided into an A-third inverting subpulse and a B-third inverting subpulse with the sum of the durations of the A-third inverting subpulse and the B-third inverting subpulse being about $2\tau_{inv}$, and wherein the fourth inverting pulse is subdivided into an A-fourth inverting subpulse and a B-fourth inverting subpulse with the sum of the durations of the A-fourth inverting subpulse and the B-fourth inverting subpulse being about $2\tau_{inv}$.

89. The method recited in claim 88, wherein the A-first inverting subpulse and the B-first inverting subpulse are separated by a waiting time of about $\tau_2$, and wherein the A-second inverting subpulse and the B-second inverting subpulse are separated by a waiting time of about $\tau_2$, and wherein the A-third inverting subpulse and the B-third inverting subpulse are separated by a waiting time of about $\tau_2$, and wherein the A-fourth inverting subpulse and the B-fourth inverting subpulse are separated by a waiting time of about $\tau_2$, and wherein $\tau_2$ is between about zero microseconds and about one hundred milliseconds.

90. A method employing NQR for canceling extraneous signals and for detecting the presence of a target substance in a specimen, the target substance having quadrupolar nuclei, the nuclei having an NQR resonant frequency, the method comprising:
- irradiating the specimen with at least one scan of a sequence of electromagnetic pulses having only a single excitation pulse, the pulse sequence being a spin-locked inversion mid-echo (SLIME) pulse sequence, the frequency of the pulses in the irradiating pulse sequence generally corresponding to the NQR resonant frequency of the target substance, the parameters of the pulses and pulse sequence being functionally effective to excite from the target substance at least one A NQR signal with any contemporaneous extraneous signals, and at least one B NQR signal with any contemporaneous extraneous signals, the phase of each A NQR signal being about opposite the phase of each B NQR signal and with the phase of the respective extraneous signals being about the same during each A and B NQR signal;

at least once, detecting an A NQR signal and a B NQR signal;

subtracting said B NQR signals and contemporaneous extraneous signals from said A NQR signals and contemporaneous extraneous signals, thereby producing a cumulative NQR signal and canceling out the extraneous signals;

comparing at least one characteristic of the cumulative NQR signal with at least one known characteristic of an NQR signal from at least one target substance to determine the presence of the target substance, the absence of the target substance, or an indeterminate result; and indicating either the presence of the target substance, the absence of the target substance, or an indeterminate result.

91. A method employing NQR for canceling extraneous signals and for detecting the presence of a target substance in a specimen, the target substance having quadrupolar nuclei, the nuclei having an NQR resonant frequency, the method comprising:

employing a spin-locked inversion mid-echo (SLIME) pulse sequence;
(a) irradiating the specimen with only a single excitation pulse of said pulse sequence having a phase of about X;
(b) at least once irradiating the specimen with a first refocusing pulse of said pulse sequence having a phase of about Y, and then;
(c) receiving an A echo signal with any contemporaneous extraneous signals transmitted from the specimen;
(d) irradiating the specimen with a second refocusing pulse of said pulse sequence having a phase of about Y;
(e) irradiating the specimen with a first inverting pulse of said pulse sequence having a phase selected from the group consisting of about X and about $\overline{X}$;
(f) at least once irradiating the specimen with a third refocusing pulse of said pulse sequence having a phase of about Y, and then;
(g) receiving a B echo signal with any contemporaneous extraneous signals transmitted from the specimen;
(h) subtracting said B echo signals and contemporaneous extraneous signals from said A echo signals and contemporaneous extraneous signals, thereby producing a cumulative echo signal and canceling out the extraneous signals;
(i) storing at least one characteristic of an NQR signal from at least one target substance;
(j) comparing at least one characteristic of the cumulative echo signal with at least one stored characteristic of an NQR signal from at least one target substance to determine the presence of the target substance, the absence of the target substance, or an indeterminate result; and
(k) indicating either the presence of the target substance, the absence of the target substance, or an indeterminate result.

92. A method employing NQR for canceling extraneous signals and for detecting the presence of a target substance in a specimen, the target substance having quadrupolar nuclei, the nuclei having an NQR resonant frequency, the method comprising:

employing a spin-locked in version mid-echo (SLIME) pulse sequence;
(a) irradiating the specimen with only a single excitation pulse of said pulse sequence having a phase of about X, and a duration of about $\tau_{ex}$, and then;
(b) waiting a time of about $\tau_3$;
(c) at least once irradiating the specimen with a first refocusing pulse of said pulse sequence having a phase of about Y, and duration of about $\tau_{ref}$, and then;
(d) receiving during a time of about $2\tau$ an A echo signal and any contemporaneous extraneous signals transmitted from the specimen;
(e) irradiating the specimen with a second refocusing pulse of said pulse sequence having a phase of about Y, and a duration of about $\tau_{ref}$, and then;
(f) waiting a time of about $\tau_1$;
(g) irradiating the specimen with a first inverting pulse of said pulse sequence having a phase selected from the group consisting of about X and about $\overline{X}$, and having a duration of about $2\tau_{inv}$, and then;
(h) waiting a time of about $\tau_1$;
(i) at least once irradiating the specimen with a third refocusing pulse of said pulse sequence having a phase of about Y, and a duration of about $\tau_{ref}$, and then;
(j) receiving during a time of about $2\tau$ a B echo signal and any contemporaneous extraneous signals transmitted from the specimen;
(k) subtracting said B echo signals and contemporaneous extraneous signals from said A echo signals and contemporaneous extraneous signals, thereby producing a cumulative echo signal and canceling out the extraneous signals;
(l) comparing at least one characteristic of the cumulative echo signal with at least one known characteristic of an NQR signal from at least one target substance to determine the presence of the target substance, the absence of the target substance, or an indeterminate result; and
(m) indicating either the presence of the target substance, the absence of the target substance, or an indeterminate result.

93. A system for producing improved NQR signals by canceling extraneous signals for use in a NQR substance detector for detecting the presence of a target substance in a specimen, the target substance having quadrupolar nuclei, the nuclei having an NQR resonant frequency, the system comprising:

means for irradiating the specimen with a sequence of electromagnetic pulses having only a single excitation pulse, the sequence having only a single excitation pulse, the pulse sequence being a spin-locked inversion mid-echo (SLIME) pulse sequence, the frequency of the pulses in the irradiating pulse sequence generally corresponding to the NQR resonant frequency of the target substance, the parameters of the pulses and pulse sequence being functionally effective to excite from the target substance at least one A NQR signal with any contemporaneous extraneous signals transmitted from the specimen and at least one B NQR signal with any contemporaneous extraneous signals transmitted from the specimen, with the phase of each A NQR signal being about opposite the phase of each B NQR signal and with the phase of the respective extraneous signals being about the same during each A and B NQR signal;

means for, at least once, detecting an A NQR signal and a B NQR signal; and means for subtracting said B echo signals and contemporaneous extraneous signals from said A echo signals and contemporaneous extraneous signals, thereby producing a cumulative NQR signal and canceling out the extraneous signals.

94. The system recited in claim 93, wherein the target substance to be detected has a nucleus selected from the group consisting of $^{14}N$, $^{35}Cl$, $^{37}Cl$, $^{23}Na$ and $^{39}K$.

95. The system recited in claim 93, wherein the amplitude of at least one of the pulses is modulated.

96. The system recited in claim 93, wherein the frequency of at least one of the pulses is modulated.

97. The system recited in claim 93, wherein the frequency of at least one of the pulses is swept from a first frequency to a second frequency, and wherein each frequency swept pulse conforms to adiabatic conditions.

98. The system recited in claim 93, wherein the frequency and amplitude of at least one of the pulses are modulated to produce a substantially rectangular frequency response in the frequency domain about centered around an NQR resonant frequency of a target substance.

99. The system recited in claim 93, wherein at least one of the pulses comprises a plurality of segments, and wherein the phase of at least one segment differs from the phase of at least one other segment.

100. A system for canceling extraneous signals for use in an NQR substance detector for detecting the presence of a target substance in a specimen, the target substance having quadrupolar nuclei, the nuclei having an NQR resonant frequency, the system comprising:

(a) means for generating a spin-locked inversion mid-echo (SLIME) pulse sequence;

(b) means for irradiating the specimen with only a single excitation pulse from said pulse sequence, the excitation pulse having a phase of about X:

(c) means for, at least once, irradiating the specimen with a first refocusing pulse from said pulse sequence, the first refocusing pulse having a phase of about Y;

(d) means for receiving an A echo signal and any contemporaneous extraneous transmitted from the specimen;

(e) means for irradiating the specimen with a second refocusing pulse from said pulse sequence, the second refocusing pulse having a phase of about Y;

(f) means for irradiating the specimen with a first inverting pulse from said pulse sequence, the first inverting pulse having a phase selected from the group consisting of about X and about $\overline{X}$;

(g) means for, at least once, irradiating the specimen with a third refocusing pulse from said pulse sequence, the third refocusing having a phase of about Y;

(h) means for receiving a B echo signal and any contemporaneous extraneous transmitted from the specimen; and (i) means for subtracting said B echo signals and contemporaneous extraneous signals from said A echo signals and contemporaneous extraneous signals to produce a cumulative echo signal and to cancel out the extraneous signals.

101. The system recited in claim 100, wherein the frequency of at least one of the pulses is modulated.

102. In an NQR substance detector for detecting the presence of a target substance in a specimen, the target substance having quadrupolar nuclei, the nuclei having an NQR resonant frequency, there being extraneous signals with the detected NQR response signals, a system for producing improved echo signals by canceling the extraneous signals, the system comprising:

(a) means for generating a spin-locked inversion mid-echo (SLIME) pulse sequence;

(b) means for irradiating the specimen with only a single excitation pulse from said pulse sequence, the excitation pulse having a phase of about X, and a duration of about $\tau_{ex}$, and then waiting a time of about $\tau_3$;

(c) means for, at least once, irradiating the specimen with a first refocusing pulse from said pulse sequence, the first refocusing pulse having a phase of about Y, and duration of about $\tau_{ref}$;

(d) means for receiving during a time of about $2\tau$ an A echo signal and any contemporaneous extraneous transmitted from the specimen;

(e) means for irradiating the specimen with a second refocusing pulse from said pulse sequence, the second refocusing pulse having a phase of about Y, and a duration of about $\tau_{ref}$, and then waiting a time of about $\tau_1$;

(f) means for irradiating the specimen with a first inverting pulse from said pulse sequence, the first investing pulse having a phase selected from the group consisting of about X and about $\overline{X}$, and having a duration of about $2\tau_{inv}$, and then waiting a time of about $\tau_1$;

(g) means for, at least once, irradiating the specimen with a third refocusing pulse from said pulse sequence, the third refocusing pulse having a phase of about Y, and a duration of about $\tau_{ref}$;

(h) means for receiving during a time of about $2\tau$ a B echo signal and any contemporaneous extraneous transmitted from the specimen; and (i) means for subtracting said B echo signals and contemporaneous extraneous signals from said A echo signals and contemporaneous extraneous signals to produce a cumulative echo signal and to cancel out the extraneous signals.

103. A system employing NQR for detecting the presence of a target substance in a specimen by canceling extraneous signals to produce improved NQR signals, the target substance having quadrupolar nuclei, the nuclei having an NQR resonant frequency, the system comprising:

means for irradiating the specimen with a sequence of electromagnetic pulses having only a single excitation pulse, the pulse sequence being a spin-locked inversion mid-echo (SLIME) pulse sequence, the frequency of the pulses in the irradiating pulse sequence generally corresponding to the NQR resonant frequency of the target substance, the parameters of the pulses and pulse sequence being functionally effective to excite from the target substance at least one A NQR signal with any contemporaneous extraneous transmitted from the specimen and at least one B NQR signal with any contemporaneous extraneous transmitted from the specimen, with the phase of each A NQR signal being about opposite the phase of each B NQR signal and with the phase of the respective extraneous signals being about the same during each A and B NQR signal;

means for, at least once, detecting an A NQR signal and a B NQR signal;

means for subtracting said B NQR signals and contemporaneous extraneous signals from said A NQR signals and contemporaneous extraneous signals to produce a cumulative NQR signal and to cancel out the extraneous signals;

means for comparing at least one characteristic of the cumulative NQR signal with at least one known characteristic of an NQR signal from at least one target substance to determine the presence of the target substance, the absence of the target substance, or an indeterminate result; and means for indicating the presence of the target substance, the absence of the target substance, or an indeterminate result.

104. An NQR detection system for canceling extraneous signals and detecting the presence of a target substance in a specimen, the target substance having quadrupolar nuclei, the nuclei having an NQR resonant frequency, the system comprising:

(a) means for generating a spin-locked inversion mid-echo (SLIME) pulse sequence;

(b) means for irradiating the specimen with only a single excitation RF pulse of said pulse sequence having a phase of about X;

(c) means for, at least once, irradiating the specimen with a first refocusing RF pulse from said pulse sequence, the first refocusing pulse having a phase of about Y;

(d) means for receiving an A RF echo signal transmitted from the specimen;

(e) means for irradiating the specimen with a second refocusing RF pulse from said pulse sequence, the second refocusing pulse having a phase of about Y;

(f) means for irradiating the specimen with a first inverting RF pulse from said pulse sequence, the first inverting pulse having a phase selected from the group consisting of about X and about $\overline{X}$;

(g) means for, at least once, irradiating the specimen with a third refocusing RF pulse from said pulse sequence, the third refocusing pulse having a phase of about Y;

(h) means for receiving a B RF echo signal with any contemporaneous extraneous signals transmitted from the specimen;

(i) means for subtracting said B RF echo signals and contemporaneous extraneous signals from said A RF echo signals and contemporaneous extraneous signals to produce a cumulative RF echo signal and to cancel out the extraneous signals;

(j) means for comparing at least one characteristic of the cumulative RF echo signal with at least one known characteristic of an NQR signal from at least one target substance to determine the presence of the target substance, the absence of the target substance, or an indeterminate result; and (k) means for indicating the presence of the target substance, the absence of the target substance, or an indeterminate result.

105. An NQR detection system for canceling extraneous signals and detecting the presence of a target substance in a specimen, the target substance having quadrupolar nuclei, the nuclei having an NQR resonant frequency, the system comprising:

(a) means for generating a spin-locked inversion mid-echo (SLIME) pulse sequence;

(b) means for irradiating the specimen with only a single excitation pulse from having a phase of about X, and a duration of about $\tau_{ex}$, and then waiting a time of about $\tau_3$;

(c) means for, at least once, irradiating the specimen with a first refocusing pulse from said pulse sequence, the first refocusing pulse having a phase of about Y, and duration of about $\tau_{ref}$;

(d) means for receiving during a time of about $2\tau$ an A echo signal with any contemporaneous extraneous transmitted from the specimen;

(e) means for irradiating the specimen with a second refocusing pulse from said pulse sequence, the second refocusing pulse having a phase of about Y, and a duration of about $\tau_{ref}$, and then waiting a time of about $\tau_1$;

(f) means for irradiating the specimen with a first inverting pulse from said pulse sequence, the first inverting pulse having a phase selected from the group consisting of about X and about $\overline{X}$, and having a duration of about $2\tau_{inv}$, and then waiting a time of about $\tau_1$;

(g) means for, at least once, irradiating the specimen with a third refocusing pulse from said pulse sequence, the third refocusing pulse having a phase of about Y, and a duration of about $\tau_{ref}$;

(h) means for receiving during a time of about $2\tau$ a B echo signal with any contemporaneous extraneous signals transmitted from the specimen;

(i) means for subtracting said B echo signals and contemporaneous extraneous signals from said A echo signals and contemporaneous extraneous signals to produce a cumulative echo signal and to cancel out the extraneous signals;

(j) means for storing at least one characteristic of an NQR signal from at least one target substance;

(k) means for comparing at least one characteristic of the cumulative echo signal with at least one stored characteristic of an NQR signal from at least one target substance to determine the presence of the target substance, the absence of the target substance, or an indeterminate result; and (l) means for indicating the presence of the target substance, the absence of the target substance, or an indeterminate result.

106. A method for producing improved NQR signals by canceling extraneous signals in an NQR detection system for detecting the presence of a target substance in a specimen, the target substance having quadrupolar nuclei, the nuclei having an NQR resonant frequency, the method comprising:

applying to the specimen a spin-locked inversion mid-echo (SLIME) pulse sequence having a single excitation pulse, each pulse in the sequence having a predetermined phase and duration, the pulses in the sequence being separated by predetermined time intervals, the pulse frequency being about the same as the NQR frequency of the target substance and, when the target substance is present in the specimen the SLIME pulse sequence manipulates the orientations of the magnetic moments of the quadrupolar nuclei of the target substance so that those nuclei generate oppositely-phased sets of NQR echo signals;

receiving the NQR echo signals and any extraneous signals in the detection system, the extraneous signals not being oppositely-phased;

subtracting NQR signals of one phase from the oppositely-phased NQR signals to produce a cumulative echo signals; and subtracting out the same phase extraneous signals.

* * * * *